US012469686B2

(12) United States Patent
Au et al.

(10) Patent No.: US 12,469,686 B2
(45) Date of Patent: Nov. 11, 2025

(54) PROCESS CHARACTERIZATION AND CORRECTION USING OPTICAL WALL PROCESS SENSOR (OWPS)

(71) Applicant: Applied Materials, Inc., Santa Clara, CA (US)

(72) Inventors: Jeffrey Yat Shan Au, Sunnyvale, CA (US); Joshua Thomas Maher, Sunnyvale, CA (US); Varoujan Chakarian, San Jose, CA (US); Sidharth Bhatia, Santa Cruz, CA (US); Patrick Tae, Sunnyvale, CA (US); Zhaozhao Zhu, Milpitas, CA (US); Blake W. Erickson, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 687 days.

(21) Appl. No.: 17/696,791

(22) Filed: Mar. 16, 2022

(65) Prior Publication Data

US 2023/0298872 A1   Sep. 21, 2023

(51) Int. Cl.
    *H01J 37/32*   (2006.01)

(52) U.S. Cl.
    CPC .. *H01J 37/32972* (2013.01); *H01J 37/32926* (2013.01); *H01J 2237/334* (2013.01)

(58) Field of Classification Search
    CPC ........... H01J 37/32972; H01J 37/32926; H01J 2237/334
    See application file for complete search history.

(56) References Cited

U.S. PATENT DOCUMENTS

| 4,594,226 A | 6/1986 | Reedy |
| 6,025,916 A | 2/2000 | Quick et al. |

(Continued)

FOREIGN PATENT DOCUMENTS

| CN | 307264985 | 4/2022 |
| CN | 307500650 | 8/2022 |

(Continued)

OTHER PUBLICATIONS

International Search Report and Written Opinion for the International Application No. PCT/US2023/015321, mailed on Jul. 5, 2023, 9 pages.

(Continued)

*Primary Examiner* — Kamini S Shah
*Assistant Examiner* — Mohammed Shafayet
(74) *Attorney, Agent, or Firm* — Lowenstein Sandler LLP

(57) ABSTRACT

A method includes receiving, by a processing device, first sensor data indicating a state of a wall corresponding to a first processing chamber. The first sensor data includes optical spectral data. The method further includes determining, by the processing device, a first value based on the first sensor data. The first value corresponds to a first amount of a product disposed along a surface of the wall at a first time. The method further includes determining, by the processing device, a first update to a first process operation associated with the first processing chamber based on the first value. The method further includes performing, by the processing device, one or more of (i) preparing a notification indicating the first update for presentation on a graphical user interface (GUI), or (ii) causing performance of the first process operation in accordance with the first update.

20 Claims, 12 Drawing Sheets

(56) References Cited

U.S. PATENT DOCUMENTS

| | | |
|---|---|---|
| 6,269,278 B1 | 7/2001 | Smith, Jr. et al. |
| 6,556,949 B1 | 4/2003 | Lyon |
| 7,578,301 B2 | 8/2009 | Hudson et al. |
| 7,591,923 B2 | 9/2009 | Mitrovic et al. |
| 8,009,288 B2 | 8/2011 | Berlin et al. |
| 8,144,328 B2 | 3/2012 | Venugopal et al. |
| 8,513,002 B2 | 8/2013 | Berlin et al. |
| D727,336 S | 4/2015 | Allison et al. |
| 9,251,360 B2 | 2/2016 | Meyer et al. |
| 9,347,132 B2 | 5/2016 | Ramachandran et al. |
| 9,363,149 B1 | 6/2016 | Chauhan et al. |
| D780,203 S | 2/2017 | Bray |
| D791,820 S | 7/2017 | Yun et al. |
| 9,747,008 B2 | 8/2017 | Allgair |
| 10,008,370 B2 | 6/2018 | Ohmori et al. |
| 10,269,545 B2 | 4/2019 | Gottscho |
| D856,364 S | 8/2019 | Beckman et al. |
| D874,487 S | 2/2020 | Sunshine et al. |
| D875,122 S | 2/2020 | Ji et al. |
| 10,615,009 B2 | 4/2020 | Guha et al. |
| 10,684,752 B2 | 6/2020 | Snyder et al. |
| 10,796,891 B2 | 10/2020 | Kim et al. |
| D931,334 S | 9/2021 | Crandall et al. |
| 11,114,286 B2 | 9/2021 | Lin et al. |
| D938,465 S | 12/2021 | Shen et al. |
| D940,163 S | 1/2022 | Huber |
| 11,261,538 B1 | 3/2022 | Moradian et al. |
| 11,276,564 B2 | 3/2022 | Gottscho |
| 11,308,049 B2 | 4/2022 | Suleiman et al. |
| 11,329,860 B2 | 5/2022 | Tee et al. |
| D967,141 S | 10/2022 | Breier et al. |
| 11,499,869 B2 | 11/2022 | Lin et al. |
| 11,727,481 B2 | 8/2023 | Visbal et al. |
| D1,009,070 S | 12/2023 | Li et al. |
| D1,009,912 S | 1/2024 | Matsushita et al. |
| D1,011,367 S | 1/2024 | Stroier |
| D1,014,521 S | 2/2024 | Liu et al. |
| 2002/0075486 A1* | 6/2002 | Zhang .................... G01N 21/41 356/630 |
| 2004/0253824 A1* | 12/2004 | Tegeder ............. G01B 11/0683 438/696 |
| 2005/0095730 A1* | 5/2005 | Mikami ............. G01B 11/0683 438/16 |
| 2005/0127192 A1 | 6/2005 | Kang et al. |
| 2005/0187649 A1 | 8/2005 | Funk et al. |
| 2006/0042753 A1 | 3/2006 | O'Leary et al. |
| 2006/0216406 A1* | 9/2006 | Hudson ............. H01J 37/32963 118/712 |
| 2007/0238199 A1 | 10/2007 | Yamashita |
| 2008/0040061 A1 | 2/2008 | Osada |
| 2008/0125899 A1 | 5/2008 | Numakura |
| 2010/0084544 A1 | 4/2010 | Tallavarjula et al. |
| 2015/0214016 A1* | 7/2015 | Ham .................. H01J 37/32972 118/712 |
| 2015/0356446 A1 | 12/2015 | Greystoke et al. |
| 2018/0010243 A1 | 1/2018 | Lee et al. |
| 2018/0040460 A1* | 2/2018 | Gottscho ........... H01J 37/32935 |
| 2018/0082826 A1* | 3/2018 | Guha ................. H01J 37/32082 |
| 2018/0164215 A1 | 6/2018 | Glacer et al. |
| 2020/0013588 A1 | 1/2020 | Lian et al. |
| 2020/0033191 A1* | 1/2020 | Chen ........................ H03F 3/08 |
| 2020/0105510 A1* | 4/2020 | Yoshida ............ H01J 37/32972 |
| 2020/0110390 A1 | 4/2020 | Banna |
| 2020/0243359 A1 | 7/2020 | Hao et al. |
| 2020/0303169 A1 | 9/2020 | Sakai |
| 2021/0116895 A1 | 4/2021 | Paul |
| 2021/0166120 A1 | 6/2021 | Tsutsui |
| 2021/0194897 A1 | 6/2021 | Putman et al. |
| 2021/0388494 A1* | 12/2021 | Tae ....................... H01L 21/681 |
| 2021/0391157 A1 | 12/2021 | Tae et al. |
| 2022/0357820 A1 | 11/2022 | Breier et al. |
| 2023/0054784 A1 | 2/2023 | Malkan et al. |
| 2023/0055634 A1 | 2/2023 | Goodrich et al. |
| 2023/0238262 A1 | 7/2023 | Yang et al. |
| 2024/0126244 A1 | 4/2024 | Furokawa et al. |

FOREIGN PATENT DOCUMENTS

| | | | |
|---|---|---|---|
| CN | 307592118 | 10/2022 | |
| CN | 307632220 | 11/2022 | |
| CN | 307919803 | 3/2023 | |
| JP | H11211424 A | 8/1999 | |
| JP | 1586557 S | 9/2017 | |
| JP | 1676567 S | 1/2021 | |
| JP | 1684291 S | 4/2021 | |
| KR | 10-2010-125370 A | 11/2010 | |
| KR | 101553149 B1 | 9/2015 | |
| KR | 102025873 B1 | 9/2019 | |
| KR | 20110127389 A | 11/2021 | |
| TW | D189295 S | 3/2018 | |
| WO | WO-2020142451 A1 * | 7/2020 | ........... C23C 14/564 |
| WO | 2020/246745 A1 | 12/2020 | |
| WO | 2021061541 A1 | 4/2021 | |

OTHER PUBLICATIONS

PCT Notification of Transmittal of The International Search Report and The Written Opinion Of The International Searching Authority for PCT Application No. PCT/US2021/037108, mailed Oct. 5, 2021, 9 pages.

23 Free & Premium HTM L5 Admin Dashboard Responsive Templates of 2018, posted Oct. 7, 2017 [online], Retrieved from internet Nov. 4, 2023, https://themewagon.com/blog/23-best-html5-bootstrap-admin-dashboard-template-2018/ (Year: 2017), pp. 1-26.

Damian Pang, A Guide to Creating Accurate Progress Indicators in Adobe XD, posted Oct. 7, 2020 [online], Retrieved from internet Nov. 4, 2023, https://uxplanet.org/a-guide-to-creating-accurate-progress-indicators-in-adobe-xd-72a43b46889d (Year: 2020).

Elena Garder, Progress Bar Set, posted Mar. 15, 2017 [online], Retrieved from internet Nov. 4, 2023, https://www.alamy.com/progress-bar-set-loading-status-bar-web-indicator-process-download-image155380367.html?imageid=D3D6E266-79D7-415C%E2%80% A6 (Year: 2017).

International Search Report and Written Opinion for International Application No. PCT/US2023/015318, mailed Jul. 7, 2023, 9 Pages.

Illust-Monster, Traffic Light Vector Illustration, posted Nov. 25, 2021 [online], Retrieved from internet Nov. 4, 2023, https://www.istockphoto.com/vector/traffic-light-vector-illustration-of-green-light-traffic-road-driving-gm1355447759-4299314307phras (Year: 2021).

Nastassia Ovchinnikova, 10 KPI Templates and Dashboards for Tracking KPIs, posted Mar. 5, 2022 [online], Retrieved from internet Nov. 4, 2023, https://flatlogic.com/blog/examples-of-dashboard-templates-for-tracking-kpi-s/ (Year: 2022).

\* cited by examiner

PROCESS CHARACTERIZATION AND CORRECTION USING OPTICAL WALL PROCESS SENSOR (OWPS)

RELATED APPLICATIONS

This patent application is related to U.S. patent application Ser. No. 17/696,794, filed Mar. 16, 2022, entitled "Process Characterization and Correction Using Optical Wall Process Sensor (OWPS)".

TECHNICAL FIELD

Embodiments of the present disclosure relate to process control and process learning utilizing an optical sensor.

BACKGROUND

Changes to conditions on surfaces of a processing chamber impacts various processing parameters. For example, re-deposition of etching byproducts on the chamber wall may alter the etching rate of a given process. Accordingly, as substrates are processed in the chamber, the etching rate (or other process parameters or states) may change and result in non-uniform processing between substrates, among other conditions.

Conventional systems lack reliable methods for monitoring surface conditions within a processing chamber, including surfaces of a liner (or inside wall), lid, electrostatic chuck (ESC), process ring, and the like. For example, the chemical, physical, and thermal condition of the liner of a processing chamber is known to impact plasma processes by affecting the recombination of outgassing near the liner. Several monitoring methods, such as capacitive or resonant frequency monitoring, are in development but these methods suffer from thermal or radio frequency noise, particularly during processing.

Further, substrate processing is subject to inefficiencies and/or inaccuracies due to a lack of information such as optical information related to a state of a processing chamber wall, particularly as processing equipment ages. For example, process shift can sometimes result in a change in deposition amount (e.g., deposition thickness) or a change in composition of the deposition, both of which may lead to unacceptable batches of processed substrates that are often scrapped. In another example, knowing when to run a cleaning process within the processing chamber can be based simply on in-process hours, amounting to little more than guesswork. However, running the cleaning process too often can impact substrate throughput, and running the cleaning process too infrequently can impact product quality. Other processing inefficiencies or inaccuracies also exist and will be discussed in more detail.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Some of the embodiments described herein cover a method that includes receiving, by a processing device, first sensor data indicating a state of a wall corresponding to a first processing chamber. The first sensor data includes optical spectral data. The method further includes determining, by the processing device, a first value based on the first sensor data. The first value corresponds to a first amount of a product disposed along a surface of the wall at a first time. The method further includes determining, by the processing device, a first update to a first process operation associated with the first processing chamber based on the first value. The method further includes performing, by the processing device, one or more of (i) preparing a notification indicating the first update for presentation on a graphical user interface (GUI) or (ii) causing performance of the first process operation in accordance with the first update.

Additional or related embodiments described herein cover a system that includes a processing chamber including a first wall with an inner surface positioned within the processing chamber. The system further includes an optical sensor coupled to the processing chamber. The optical sensor is configured to acquire spectral data associated with the inner surface. The system further includes a memory, and a processing device coupled to the memory. The processing device is to receive first sensor data indicating a state of a wall corresponding to a first processing chamber. The first sensor data includes optical spectral data. The processing device is further to determine a first value based on the first sensor data. The first value corresponds to a first amount of a product disposed along a surface of the wall at a first time. The processing device is further to determine a first update to a first process operation associated with the first processing chamber based on the first value. The processing device is further to perform one or more of (i) prepare a notification indicating the first update for presentation on a GUI or (ii) cause performance of the first process operation in accordance with the first update.

Additional, or related embodiments described herein cover a non-transitory machine-readable storage medium storing instructions which, when executed, cause a processing device to receive first sensor data indicating a state of a wall corresponding to a first processing chamber. The first sensor data includes optical spectral data. The processing device is further to determine a first value based on the first sensor data. The first value corresponds to a first amount of a product disposed along a surface of the wall at a first time. The processing device is further to determine a first update to a first process operation associated with the first processing chamber based on the first value. The processing device is further to perform one or more of (i) prepare a notification indicating the first update for presentation on a GUI or (ii) cause performance of the first process operation in accordance with the first update.

Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
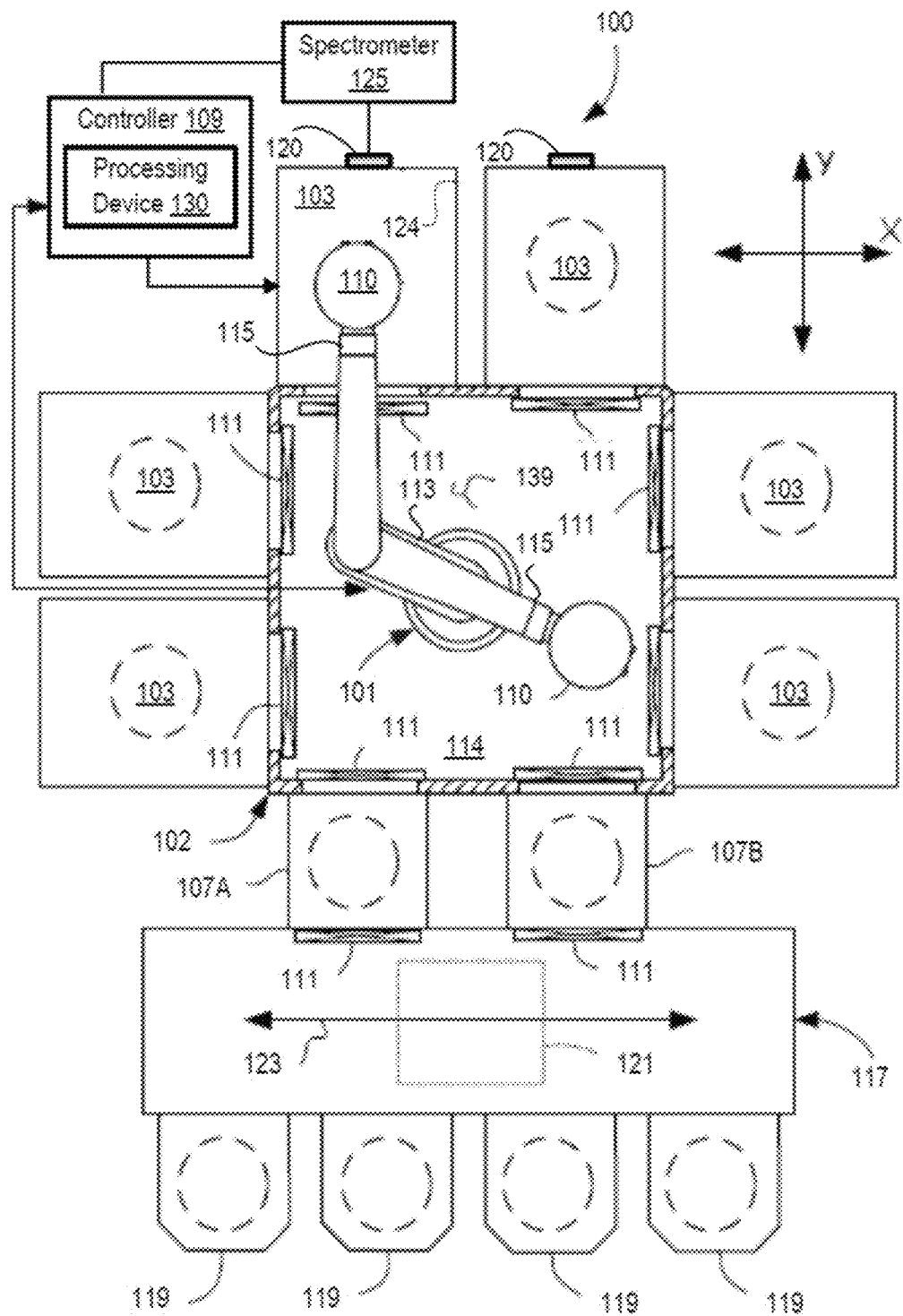
FIG. 1 is a top schematic view of an example processing system, according to some embodiments.

Embodiments described herein relate to systems and methods for process control and process learning using optical wall process sensors (OWPS). For example, data from OWPS may be used in embodiments to update process parameters of one or more processes. The systems and methods may make use of one or more sensors (e.g., OWPS) that can measure one or more properties of a coating on a chamber wall, and may optionally use machine learning techniques to analyze data from such sensors. In one embodiment, the systems and methods make use of interferometric reflectometry with reference to a liner (or inner wall) of a processing chamber to determine a condition and/or process state of the processing chamber. Reflectometry, for example, may be used to determine one or more optical thin film properties of a thin film layer (e.g., a process film layer) deposited on the liner surface or on a reflector surface that is proximate to, and substantially represents, the liner. Optical properties of the film may be determined before, during and/or after processes such as deposition processes, etch processes, and cleaning processes. Optical properties of films (e.g., optical thin film properties) may include, but are not limited to, thickness, refractive index (n) and extinction coefficient (k) values, chemical character of the film, etc.

In some systems, a character (e.g., one or more property values) of a film deposited on a surface within a processing chamber is to be monitored. In some embodiments, deposition or etching of a film on a surface or the processing chamber may be used to infer etch or deposition rates of material on a substrate. In some embodiments, performance of a processing operation may be inferred from properties of the film. In some embodiments, the processing operation may be a cleaning operation, such as a cleaning operation that is performed between processing of some substrates.

In conventional systems, coupons may be utilized to monitor a thin film deposited on a surface within a processing chamber. A removable object (e.g., coupon, or thin sheet) may be disposed on a surface within a processing chamber (e.g., interior sidewall, liner, etc.). After some amount of time has passed, the coupon may be removed from the chamber and a film on the surface of the coupon analyzed. This practice may be cumbersome in a number of ways. Placing coupons into processing chamber and removing those coupons from the chamber may include exposing the interior of the processing chamber to ambient atmospheric conditions. In some embodiments, returning to processing conditions (e.g., clean interior, vacuum interior, etc.) may be expensive in terms of time expended, energy expended, wear on components, etc. In some embodiments, returning to an operable state may include a cleaning operation, a chamber conditioning operation, a chamber coating operation, and/or a chamber seasoning operation after exposing the interior of the processing chamber to ambient conditions. Utilizing coupon-based methods may limit the frequency with which film development may be analyzed. Additionally, coupons may be measured between processing operations, but not during an operation of the processing chamber (e.g., during a deposition process, an etch process, or a cleaning process).

Embodiments of the current disclosure may address at least some of these deficiencies of conventional solutions. In some embodiments, measurements may be taken by an optical sensor configured to detect a signal from a film on an inner surface of the processing chamber. In some embodiments, determining the state of the processing chamber is performed in the course of processing of substrates within the processing chamber. In some embodiments, determining the state of the processing chamber is performed before, during and/or after processing of substrates. In some embodiments, determining the state of the processing chamber is performed before, during and/or after a cleaning operation or other operation that is performed without substrates in the processing chamber.

In some embodiments, determining the state of the processing chamber may involve adapting analysis to account for the presence of plasma, which may be a source of electromagnetic radiation, in the processing chamber. Plasma includes corrosive gases used for etching the substrates. In some embodiments, one or more optical thin film properties are determined before or after processing, and need not compensate for extant plasma during an active process.

In various embodiments, the condition of a portion of the liner of the processing chamber is indicative of the condition of surfaces of the processing chamber generally. For example, a condition may indicate a process shift (or drift) for which correction should be taken (e.g., via calibration, cleaning, and/or replacement of processing equipment or of other structures of the processing chamber). Process shift may impact performance and yield of processed substrates. By tracking such process shift using OWPS data, systems and methods described herein may use such process shift (e.g., drift) information to compensate for drift and/or determine when and/or how to perform maintenance (e.g., cleaning operations).

In another example, a thickness of deposited film layers on an interior surface of the processing chamber may be correlated with deposited thin films on substrates being processed (e.g., measured during processing). Characterizing thin films deposited on one or more interior surfaces of the processing chamber may be extended to identify and manage deposition rates, deposition amounts, process start and/or end conditions, frequency of a process, etc. For example, optimal frequency and duration of cleaning procedures may be ascertained using the surface conditions within the processing chamber. Frequency and duration of other operations, such as chamber conditioning operations, chamber coating operations, chamber seasoning operations, etc., may also be ascertained. Further advantages include reducing disruptions to the plasma volume while performing reflectometry (e.g., during substrate processing). The present embodiments may include one or more of the above advantages with minimal modification to existing liner and processing chamber designs.

Some embodiments of disclosed systems and methods include a light source (e.g., broadband light source), a spectrometer (or other apparatus for recording and measuring incident light as a method of analysis), and a light coupling device such as a collimator or mirror. These embodiments, as well as a processing chamber that is part of the disclosed system, may further include a transparent material (e.g., crystal) at least a part of which is embedded within a wall and the liner of the processing chamber. The transparent material may be made of a transparent ceramic material, or may be made of a transparent material such as sapphire, diamond, quartz, or silicon carbide for example. A transparent thin film (or substrate) may be formed on a surface of the transparent material that is exposed to an interior of the processing chamber. The transparent material may act as a window for the process chamber. The transparent thin film may be deposited via a deposition using atomic layer deposition (ALD), chemical vapor deposition (CVD), plasma vapor deposition (PVD), or another method of depositing a thing film on a surface. The transparent thing film may be comprise yttrium oxide, aluminum oxide, zirconium oxide, combination thereof, or another transparent material (e.g., such as a transparent crystalline material). In one embodiment, the transparent thin film is approximately flush with a surface of the liner. The transparent thin film may also have chemical properties substantially matching those of the liner.

In various embodiments, during processing within the chamber, the light coupling device may direct light from the light source through the transparent material, through the transparent thin film, and to a process film layer deposited on the transparent thin film. In this way, light passing through both the transparent crystal and the transparent thin film reflect back from their respective surfaces, and combine with light reflected off a surface of the process film layer deposited on the transparent thin film. This reflected light may include a first spectrum consistent with the condition of the process film layer deposited on the liner.

In some embodiments, the light coupling device directs the reflected light (e.g., combination of light reflected off various surfaces) to a light-detecting device. In some embodiments, the light coupling device focuses the combination of this reflected light into a fiber optic cable that is coupled to a spectrometer. The spectrometer may detect a first spectrum of the focused light that is representative of the process film layer and may be used to determine optical thin film properties. The spectrometer may also, during processing within the chamber, detect a second instance (e.g., spectrum) of the focused light when the light source is turned off. This second measurement may be utilized for background subtraction, normalization, etc. In some embodiments, the second light measurement corresponds to the optical emission spectroscopy (OES) of a plasma in the process chamber during measurement and can be removed from the first measurement to result in a reflectometry signal isolating the effects of the process film layer deposited on the surface of the liner (e.g., and optionally of the transparent material and/or transparent thin film beneath the process film layer).

The embodiments of the system and method may also include a processing device (or controller) coupled to the spectrometer. The processing device may be adapted to receive the first measurement (e.g., spectrum) and the second measurement, and calculate reflectometry data by subtracting (e.g., subtraction of) the second data from the first data. The processing device may calculate a reflectometry signal by dividing (e.g., division of) the reflectometry data by a reference spectrum, which normalizes the reflectometry data. The reference spectrum may be obtained under known conditions, such as during initial installation of the system, shortly after a maintenance or a seasoning event, etc.

The processing device may then fit the reflectometry signal to a thin film optical model to determine information that includes one or more property (e.g., optical thin film property) of the process film layer. Such properties may include, but are not limited to, thickness (e.g., optical thickness), values of refractive index (n) and extinction coefficient (k) values, reflectivity and/or transmissivity (any of which may be wavelength dependent), and/or a composition material. The one or more properties may in turn inform determination of certain endpoints associated with processes performed within the processing chamber, including, but not limited to, whether to adjust a rate of deposition, when to stop deposition of a chemical or plasma, when to start cleaning the processing chamber, when to stop cleaning the processing chamber, and an amount of process drift or spent chamber life. In some embodiments, the one or more film properties may indicate an anomaly in the processing equipment, such as abnormal or corrupted input material, a hardware fault, processing equipment aging or drift, etc.

In an embodiment, for example, the processing device (or controller) compares the thickness of the process film layer with a baseline measurement, e.g., taken when the processing chamber was first put into operation. If this value varies beyond a threshold variation (e.g., for thickness of the process film layer), the processing device may trigger a process within the processing chamber that is to correct the rate of deposition or etching of the process film layer (e.g., a cleaning process, a calibration process, etc.). The processing device may also alter a process to restore a process state and/or may alert a user of the processing chamber of a process shift, among other actions that will be discussed.

In some embodiments, the processing device (or controller) determines a dimensionless value corresponding to a character of the process film layer on the transparent thin film and/or on the chamber wall/liner. The character of the film may include thickness, optical properties, chemical properties, etc. The dimensionless value may indicate trends in the character of the process film layer. For example, a higher dimensionless value may correspond to a larger thickness. The dimensionless value may correspond to a ratio and/or a percentage, e.g., a ratio of a maximum acceptable value. The dimensionless value may be associated with a critical wall thickness (e.g., a critical thickness of the process film layer). The dimensionless value may correlate the process film layer thickness to a maximum and/or minimum allowed thickness (e.g., by ratio or percentage). The dimensionless value may be an index corresponding to the process film layer character. The processing device may determine an update to a process operation based on the dimensionless value. The processing device may calibrate one or more sensors of the processing chamber based on the dimensionless value. Additionally, the processing device may receive sensor data corresponding to a second processing chamber (e.g., another processing chamber) and determine a second dimensionless value that corresponds to a character of the process film layer in the second processing chamber. The first and second dimensionless values may be normalized to each other by the processing device. The processing device may normalize the first and second dimensionless values by a data normalization process. The processing device may further calibrate the sensors of both processing chamber based on the first and second values. The processing device may further update recipe operations (e.g., cleaning operations, deposition operations, etch operations, etc.) based on the first and second values.

Implementations of the present disclosure address deficiencies of the current technology by providing techniques for updating process parameters based on an optical chamber wall value. The updating of process parameters may enable increased optimization (e.g., substrate yield) of a process operation associated with a processing chamber of a manufacturing system. Embodiments of the present disclosure provide techniques to update process operations at improved rates over conventional processing systems. The provided techniques may result in more efficient operation of a processing chamber and lead to greater throughput. Additionally, embodiments of the present disclosure provide for closer monitoring of a condition of a processing chamber by determining a dimensionless value based on sensor data indicative of the thickness of material on an inner surface of the processing chamber. Closer monitoring of processing chamber conditions may reduce processing chamber down time by scheduling maintenance, cleaning, seasoning, conditioning, etc., as chamber quality changes or chamber performance deteriorates. The reduced downtime may lead to increased overall throughput and efficiency of the processing chamber over conventional systems.

Additionally, embodiments of the present disclosure provide improvements to sensor accuracy by calibrating one or more sensors of the processing chamber based on the dimensionless value derived from measurements of the OWPS sensor(s). Calibrating the sensors based on the dimensionless value may account for sensor drift. In some embodiments, sensor drift may occur due to a buildup of material on an inner surface of the processing chamber. The improved sensor accuracy may in turn improve the precision of carrying out process operations and/or procedures. Overall, the present disclosure allows greater control over process operations and parameters which can result in increased process precision, consistency, and throughput. Accordingly, the system controller may consume fewer computing resources (e.g., processing cycles, memory space, etc.) for performing substrate processes at the manufacturing system, which improves overall efficiency and decreases overall latency of the computing system associated with the manufacturing system.

A method of the present disclosure includes receiving, by a processing device, first data from an optical sensor of a processing chamber. The method further includes processing the first data to obtain second data. The second data includes an indication of a condition of a coating on an interior surface of the processing chamber. The method further includes generating an indication of performance of a processing operation of the processing chamber in view of the second data. The method further includes causing performance of a corrective action in view of the indication of performance of the processing chamber. Corrective actions may include adjusting a processing recipe, for example adjusting a processing recipe endpoint, scheduling maintenance, alerting a user, etc.

A further aspect of the present disclosure includes a non-transferable machine-readable storage medium. The storage medium stores instructions. The instructions, when executed by a processing device, cause the processing device to perform operations. The operations include receiving, by the processing device, first data from an optical sensor of a processing chamber, wherein the first data is associated with a first operation of the processing chamber. The operations further include receiving second data from the optical sensor of the processing chamber, wherein the second data is associated with a second operation of the processing chamber. The operations stored in the storage medium further include generating a first and second indication of performance of the processing chamber based on the first and second data. The operations stored in the storage medium further include determining one or more differences in performance between the first operation and the second operation. The operations stored in the storage medium further include causing performance of a corrective action based on the one or more differences. Corrective actions may include adjustments to a processing recipe, for example adjustment to the endpoint of a processing recipe. Corrective actions may include scheduling maintenance, such as corrective or preventative maintenance. Corrective actions may include providing an alert to a user.

A further aspect of the present disclosure includes a method, the method including receiving, by a processing device, first data from an optical sensor of a first processing chamber. The method further includes receiving second data from an optical sensor of a second processing chamber. The method further includes generating a first indication of performance of the first processing chamber based on the first data and a second indication of performance of the second processing chamber based on the second data. The method further includes determining one or more differences in performance between the first processing chamber and the second processing chamber. The method further includes causing performance of a corrective action based on the one or more differences. Corrective actions may include updating a process recipe, such as updating a process recipe endpoint, scheduling maintenance, providing an alert to a user, etc.

FIG. 1 is a top schematic view of an example processing system 100, according to one aspect of the disclosure. Processing system 100 includes a transfer chamber robot 101 and a factory interface robot 121 each adapted to pick and place substrates 110 (sometimes referred to as "wafers" or "semiconductor wafers") from or to a destination in an electronic device processing system such as the processing system 100 illustrated in FIG. 1. However, any type of electronic device substrate, mask, or other silica-containing substrate (generally referred to as "substrates" herein) may be conveyed and transferred by the disclosed robots. For example, the destination for the substrates 110 may be one or more processing chambers 103 and/or one or more of the load lock apparatus 107A, 107B that may be distributed about and coupled to a transfer chamber 114. As shown, substrate transfers may be through slit valves 111, for example.

Processing system 100 may further include a mainframe 102 including the transfer chamber 114 and at least two processing chambers 103. A housing of the mainframe 102 includes the transfer chamber 114 therein. The transfer chamber 114 may include top wall (not shown), bottom wall (floor) 139, and side walls, and, in some embodiments, may be maintained in a vacuum, for example. In the depicted embodiment, the transfer chamber robot 101 is mounted to the bottom wall (floor) 139. However, the transfer chamber robot 101 could be mounted elsewhere, such as to the top wall.

In various embodiments, processing chambers 103 may be adapted to carry out any number of processes on substrates 110. The processes may include deposition, oxidation, nitration, etching, polishing, cleaning, lithography, metrology (e.g., integrated metrology), or the like. Other processes may be carried out as well. The load lock apparatus 107A, 107B may be adapted to interface with a factory interface 117 or other system component, that may receive substrates 110 from substrate carriers 119 (e.g., Front Opening Unified Pods (FOUPs)) that may be docked at load ports of the factory interface 117, for example. The factory interface robot 121 (shown dotted) may be used to transfer the substrates 110 between the substrate carriers 119 and each load lock apparatus 107A, 107B. Transfers of the substrates 110 may be carried out in any sequence or direction. The factory interface robot 121 may be identical (or similar) to the transfer chamber robot 101 in some embodiments, but may further include a mechanism to allow the factory interface robot to move in either lateral direction and indicated by arrow 123. Any other suitable robot may be used as the factory interface robot 121. In some embodiments, system 100 may be coupled to (e.g., interface with) a metrology system, e.g., an integrated metrology system.

In embodiments, and by way of exemplified explanation for any robot, the transfer chamber robot 101 includes at least one arm 113 (e.g., a robot arm) and at least one end effector 115 coupled to the arm 113. The end effector 115 is controllable by the transfer chamber robot 101 in order to pick up a substrate 110 from a load lock apparatus 107A or 107B, guide the substrate 110 through one of the slit valves 111 of a processing chamber 103, and accurately place the substrate 110 onto a substrate support of the processing chamber 103.

In various embodiments, one or more of the processing chambers 103 may include a transparent window 120 (e.g., a transparent material such as a transparent crystal), at least a part of which is embedded in a wall and liner 124 (e.g., inner wall) of the processing chamber 103. In disclosed embodiments, light may be collimated and directed to the transparent window 120 to generate reflected light. The reflected light may then travel back through the transparent window 120, as will be discussed in more detail with reference to FIGS. 2-3. The reflected light may then be collected for further analysis. In some embodiments, the reflected light may be focused into a fiber optic cable that is coupled to a spectrometer 125 for analysis, e.g., spectral analysis. Spectrometer 125 may perform reflectometry to determine one or more spectra of the focused light that may be used to determine at least one optical property of a deposited process film layer on the transparent window 120 (e.g., on a transparent thin film of the transparent window), whether during or after substrate processing. The transparent window 120 and the spectrometer 125 may comprise an optical sensor associated with the processing chamber 103. The transparent window 120 and the spectrometer 125 may comprise an optical wall process sensor (OWPS). The optical sensor may detect at least one property of a material on an inner surface of the processing chamber 103 (e.g., on the transparent window). In some embodiments, by way of a thin-film optical calculation by a processing device (e.g., processing device 130), the optical sensor may provide sensor data indicative of the thickness of the material on an inner surface of the processing chamber 103.

A controller 109 (e.g., a tool and equipment controller) may control various aspects of the processing system 100, e.g., gas pressure in the processing chamber 103, individual gas flows, spatial flow ratios, temperature of various chamber components, and radio frequency (RF) or electrical state of the processing chamber 103. The controller 109 may receive signals from and send commands to the factory interface robot 121, the transfer chamber robot 101, one or more sensors, and/or other processing components of the processing system 100. The controller 109 may thus control the initiation and cessation of processing, may adjust a deposition rate, type or mix of deposition composition, and the like. The controller 109 may further receive and process sensing data from various sensors.

In various embodiments, the controller 109 includes (or is coupled to) a processing device 130 and is coupled to the spectrometer 125. The processing device 130 may be configured to receive and process sensor data, including the results of reflectometry performed by the spectrometer 125. Processing device 130 may be configured to accept multiple measurements and perform signal processing, e.g., configured to isolate effects of a thin film (e.g., from the optical influence of plasma generation) by receiving data collected with and without an external light source. Processing device 130 may calculate the reflectometry signal by subtracting a second measurement from a first measurement, e.g., a second spectrum from a first spectrum. The processing device may then fit the reflectometry signal to a thin film optical model to determine information that includes one or more optical thin film properties of the process film layer. From the thin film optical model, processing device 130 may determine one or more characteristics of a process product deposited on a wall of the processing chamber 103. Characteristics may be calculated by processing device 130, including thickness (e.g., optical thickness), reflectance, chemical character, etc. Depending on results of analyzing the one or more optical film properties, processing device 130 (e.g., the controller 109) may perform one or more actions. For example, processing device 130 may direct processing chamber 103 in a process change or adjustment. For example, controller 109 may adjust a processing parameter or setting, such as, for example, a rate of deposition, a type or mix of deposition composition, timing of performing a cleaning process within the processing chamber, and other actions that will be discussed in more detail with reference to FIG. 7. Additionally, in some embodiments, controller 109 may cause calibration of one or more sensors of processing chamber 103 based on results of analyzing the one or more optical film properties, may perform chamber matching based on results of analyzing the one or more optical film properties, identify chamber drift based on results of analyzing the one or more optical film properties, and so on.

In some embodiments, processing device 130 may determine a dimensionless value based on the results of analyzing the one or more optical film properties. In some embodiments, the dimensionless value corresponds to a first amount of the process product (e.g., a thickness of the process film layer) deposited on the transparent thin film. The dimensionless value may be indicative of an amount of the process product deposited on the interior surfaces of the processing chamber 103. The processing device 130 may make updates to a recipe (e.g., a cleaning recipe, an etch recipe, a deposition recipe, etc.) based on the dimensionless value. Additionally, the dimensionless value may be normalized, by processing device 130, with dimensionless values corresponding to one or more other processing chambers 103 to further update a recipe or calibrate one or more sensors. The recipes of the other processing chambers 103 may be updated and sensors calibrated based on the normalized dimensionless value.

Controller 109 and/or processing device 130 may be and/or include a computing device such as a personal computer, a server computer, a programmable logic controller (PLC), a microcontroller, and so on. The controller 109 and/or the processing device 130 may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. Controller 109 and/or processing device 130 may include a data storage device (e.g., one or more disk drives and/or solid state drives), a main memory, a static memory, a network interface, and/or other components. Processing device 130 may execute instructions to perform any one or more of the methodologies and/or embodiments described herein. The instructions may be stored on a computer readable storage medium, which may include the main memory, static memory, secondary storage and/or processing device (during execution of the instructions).

Figure 2:
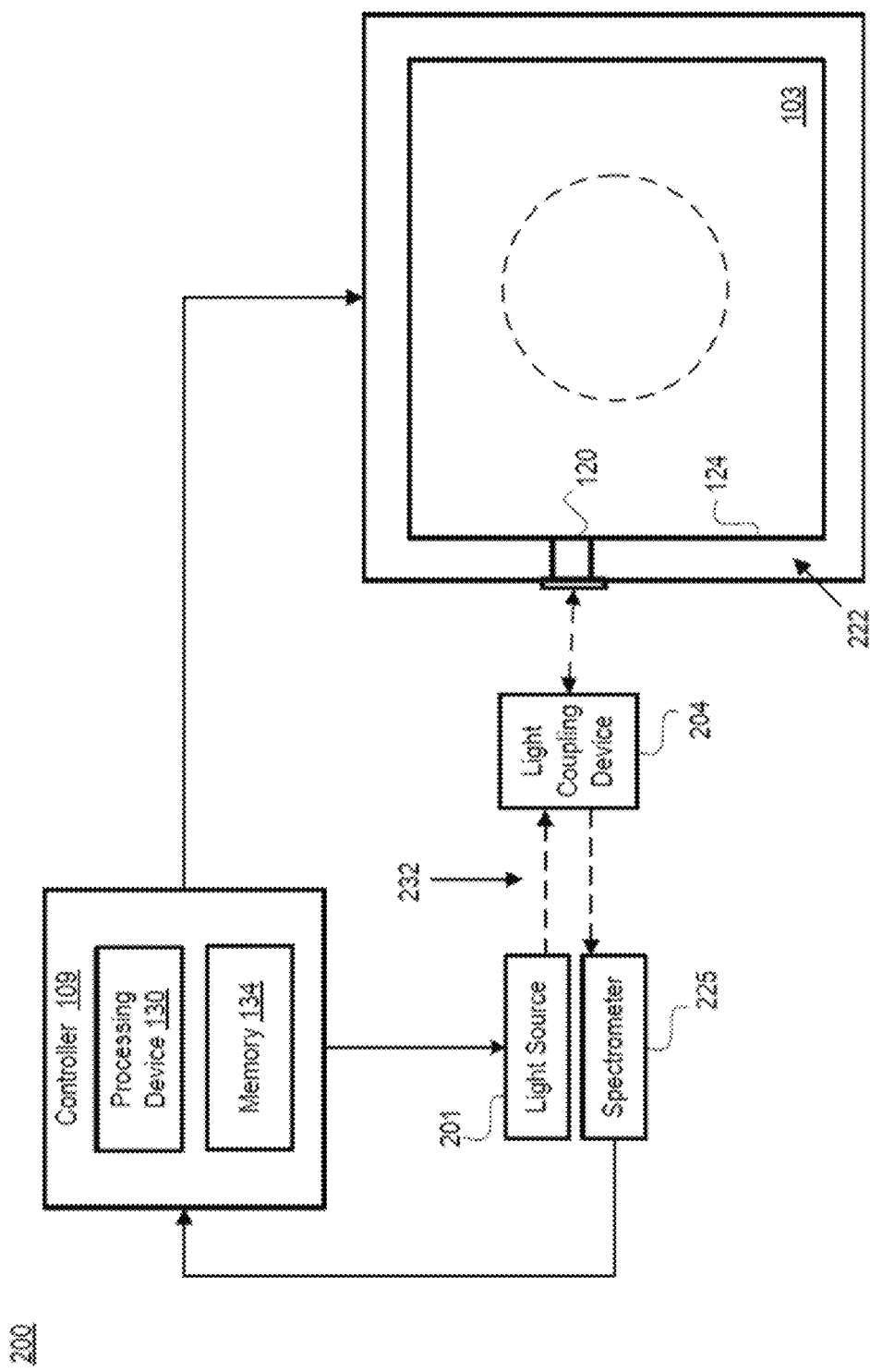
FIG. 2 is a simplified side view of a system for monitoring a processing chamber, according to some embodiments.

FIG. 2 illustrates a simplified side view of a system 200 for monitoring a processing chamber, according to one aspect of the disclosure. System 200 may include an optical sensor which creates optical data indicative of one or more characteristics of material on an inner surface of a processing chamber. In some embodiments, the optical sensor may collect spectral data. In some embodiments, the optical sensor may be configured to generate data indicative of an amount of material deposited on a transparent window (e.g., transparent material or transparent crystal) proximate to the optical sensor. In some embodiments, the optical sensor may be configured to generate data indicative of thickness of a film deposited on an interior surface of the processing chamber, e.g., as related to a measurement indicative of an amount of material.

The system 200 may include, for example, processing chamber 103, which includes liner 124, as was illustrated in FIG. 1. Processing chamber 103 may include wall 222 to which liner 124 is attached. Liner 124 is specially designed to have high chemical resistance to the process chemistries to be performed in chamber 103. Chemical resistance of liner 124 may minimize physical or chemical change to liner 124. Chemical resistance of liner 124 may increase a lifetime (e.g., time before maintenance, time before replacement) of liner 124. Furthermore, at least part of transparent window 120 may be embedded within wall 222 and liner 124, as illustrated. Transparent window 120 may be made of transparent ceramic material, or may be made of a durable transparent material such as sapphire, diamond, quartz, silicon carbide, or a combination thereof.

In embodiments, system 200 further includes a light source 201 (e.g., a broadband light source or other source of electromagnetic radiation), a light coupling device 204 (e.g., a collimator or a mirror), spectrometer 225, controller 109, and processing device 130. Light source 201 and spectrometer 225 may be optically coupled to the light coupling device 204 through one or more couplings 232, which may comprise fiber optic cables.

In some embodiments, light source 201 is a flash lamp. Light source 201 may generate predictable illumination, e.g., in terms of power, color, spectrum, etc. In some embodiments, wavelengths generated by light source 201 may be restricted, e.g., wavelengths may be restricted to a 200-800 nanometer (nm) wavelength range. In some embodiments, light source 201 may comprise a pulsed source, such as a pulsed flash lamp. In some embodiments, light source 201 is a pulsed Xenon source. In some embodiments, power of light source 201 may be predictable, e.g., light source 201 may be a flash lamp which exhibits less than 0.5% sigma flash power variation across a full wavelength range within an open loop. In other embodiments, the wavelength range and power variation may be different than those discussed above, and still be within the scope of this disclosure. In some embodiments, emitted wavelengths may comprise near infrared wavelengths. For some practical light sources, the variable power control of light source 201 may be between 45% and 100%, while providing less than an 8% power decrease over a lifetime of at least one year, which can provide more than a billion flashes. Additional or different embodiments are envisioned for a light source 201 with varying capabilities and wavelengths.

In various embodiments, light coupling device 204 may be adapted to collimate or otherwise transmit light in two directions along an optical path. A first direction may include light from the light source 201 that is to be collimated and transmitted into the processing chamber 103 through the transparent window 120. A second direction may be reflected light from the transparent window 120 that passes back into the light coupling device 204, which will be discussed in more detail with reference to FIG. 3. The reflected light may be focused into the coupler 232 (e.g., a fiber optic cable) and thus directed to spectrometer 225 in the second direction along the optical path. Further, coupler 232 may be coupled between spectrometer 225 and light source 201 for efficient transfer of light between the light source 201, to the transparent window 120, and back to spectrometer 225.

In an embodiment, spectrometer 225 also has a similar detection range to the wavelength range of the light source. In some embodiments, spectrometer 225 may have a detection range (e.g., a range of wavelengths at which the spectrometer operates, for example spread in visible, UV, infrared, etc. wavelengths), a wavelength resolution (e.g., a description of the proficiency of spectrometer 225 at separating light of different wavelengths), a sampling rate, etc. Properties of spectrometer 225 may be tuned to analysis of a chamber type, recipe type, coating type, etc. Spectrometer 225 may be calibrated according to the same schedule as light source 201, or may be calibrated and/or maintained more or less frequently. Spectrometer 225 may be adapted to detect a spectrum of the reflected light received from the light coupling device 204, e.g., the light that has reflected back from the transparent window 120 and been focused by the light coupling device 204 into coupler 232.

In various embodiments, controller 109 includes or is coupled to processing device 130 and includes or is coupled to a memory 134 or other computer storage. The controller 109 may be communicatively coupled to light source 201, spectrometer 225, and processing chamber 103. Controller 109 may direct light source 201 to flash on and then receive a first measurement (e.g., spectrum) from spectrometer 225. The controller 109 may also keep the light source off and receive a second measurement from the spectrometer 225 when light source 201 is off. The second measurement may represent the OES of the plasma or another light-emitting chemical process within the processing chamber. Processing device 130 may subtract the second measurement from the first measurement to determine the reflectometry signal for a moment in time. The processing device 130 may then mathematically fit the reflectometry signal to one or more thin film models to determine one or more optical thin film properties of the process film layer that has been deposited on the transparent thin film of the transparent crystal 120.

In some embodiments, the one or more optical thin film properties include deposited film thickness (e.g., optical thickness) as well as the refractive index (n) and extinction coefficient (k) values. The refractive index is the ratio of the speed of light in a vacuum to the speed of light in the process film layer. The extinction coefficient is a measure of how much light is absorbed in the process film layer. In embodiments, the processing device 130 may determine, using the n and k values, a composition of the process film layer. The processing device 130 may further be configured to analyze the data of the one or more optical film properties, and trigger a new process (e.g., a cleaning or maintenance process) or update a current process (e.g., a deposition process, cleaning process, etch process, etc.) within the processing chamber 103 based on the analysis. Processing device 130 may determine a dimensionless value based on the analyzed data, upon which the trigger or update may be based. Such updates may include alerts and will be discussed in more detail with reference to FIG. 7.

Figure 3:
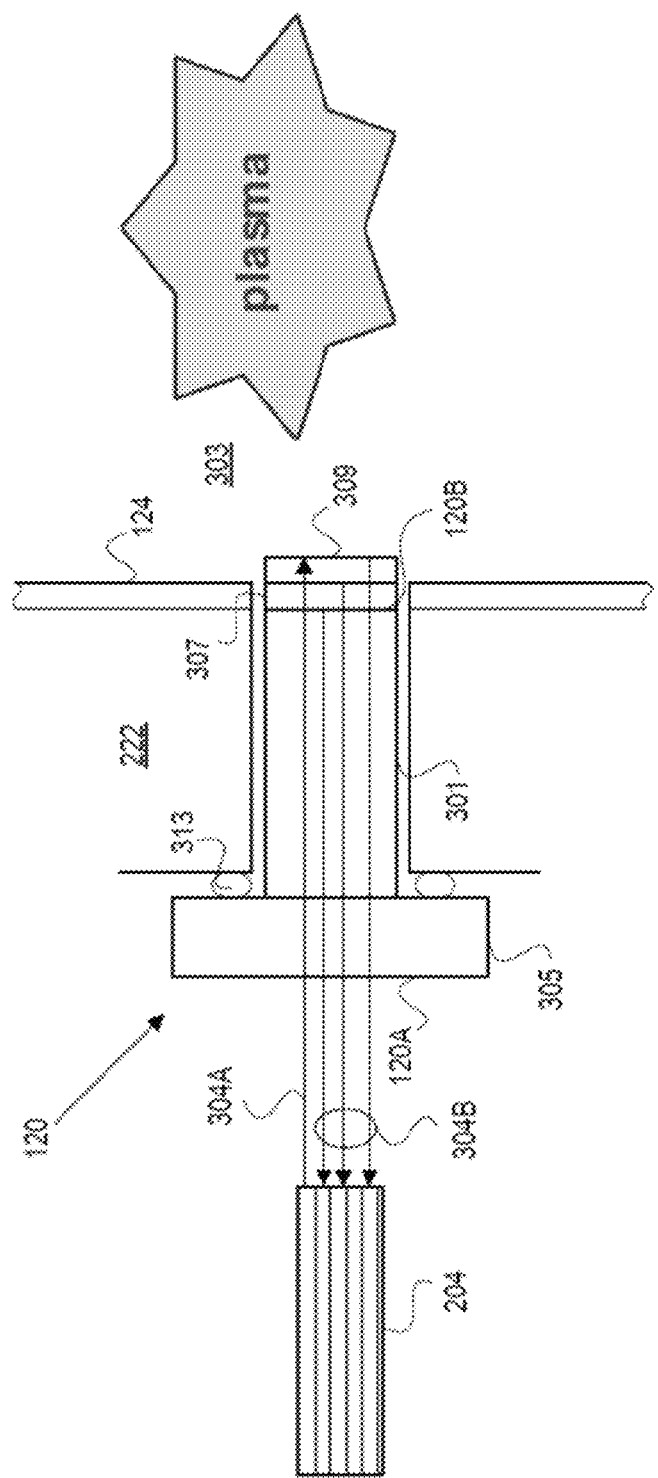
FIG. 3 is an enlarged portion of the side view of the system of FIG. 2 illustrating a transparent crystal and deposited transparent thin film embedded within a wall and a liner of a processing chamber, according to some embodiments.

FIG. 3 is an enlarged portion of the side view of the system of FIG. 2 illustrating the transparent window 120 embedded within the wall 222 and the liner 124 of a processing chamber 303, according to an embodiment. The transparent window 120 may have a proximal end and a distal end, the proximal end having a proximal surface 120A that receives light from the light coupling device 204 and the distal end 120B having a distal surface 120B to reflect the light back to the light coupling device 204 through the proximal surface 120A. In some embodiments, proximal surface 120A may also reflect light. The distal surface 120B of the transparent window 120 may be proximate to the processing chamber 303 and can be made approximately flush with the inside surface of the wall 222 in one embodiment.

In various embodiments, transparent window 120 may be shaped like a plug (e.g., be plug-shaped) and include a shaft 301 and a flange 305 integrally formed with or attached to the shaft 301. The plug may be a sapphire plug, a diamond plug, a quartz plug, or a silicon carbide plug, for example. The shaft 301 and/or the flange 305 may be square, rectangular, cylindrical, or other shape. For simplicity of illustration, the shaft 301 and the flange 305 are both illustrated as being cylindrical. As discussed, the transparent window 120 may be made out of a transparent crystalline material such as sapphire, diamond, quartz, silicon carbide, or the like to provide a hard material resistant to change and be reflective of light. Shaft 301 may be embedded within wall 222 and liner 124 such that the distal surface is exposed to an interior of the processing chamber 303.

Flange 305 may abut an outside surface of wall 222. In an embodiment, a seal 313 is positioned between the flange and the outside surface of the wall 222. The seal 313 may be, for example, an O-ring seal, a rectangular seal or gasket seal, a bulb seal, and the like. A material of the seal 313 may be propylene diene monomer, a fluoroelastomer, or the like. In some embodiments, the seal may be placed differently, e.g., along shaft 301, and be within the scope of this disclosure. The flange 305 may have an inner surface that is in physical contact with the seal 313, where the inner surface includes a surface roughness (Ra) of less than 20 nanometers or an at least 80/50 scratch dig value, which is an optical specification used for surface roughness. The highly smooth inner surface of the flange 305 may help provide a tight seal between the ambient atmosphere outside of the processing systems 100, 200 and the highly clean, filtered air of the processing chamber 303, which may be under vacuum.

In various embodiments, a transparent thin film 307 may be deposited, e.g., via atomic layer deposition (ALD), onto the distal surface 120B of the shaft 301 of the transparent window 120. In some cases, the transparent thin film 307 is deposited on the transparent window 120 before the transparent window 120 is embedded within the wall 222 and the liner 124. Transparent thin film 307 may be exposed to the interior of the processing chamber 303. In some embodiments, the transparent thin film 307 is approximately flush with the liner 124 and made to have chemical properties substantially matching those of the liner, as was discussed previously. In various embodiments, the transparent thin film 307 comprises yttrium oxide, aluminum oxide, zirconium oxide, or a combination thereof to make a similar transparent alloy. In one embodiment, the transparent thin film 307 comprises yttrium oxide, is between 10 nm to 1 micrometer (μm) thick, e.g., 270 nm thick, and is deposited to a known thickness, which helps analyze the reflected light.

In various embodiments, the deposition process (e.g., ALD) of the transparent thin film 307 is carefully controlled to ensure it mimics the material of the liner 124 but is in a different physical state, e.g., being smoother and flatter, in order to facilitate the reflection of light from its surface. In this way, transparent thin film 307 reflects light in a way that provides data that may be used to generate an accurate assessment of a condition of the chamber. In some embodiments the thinness and smoothness of transparent thin film 307 increases signal-to-noise ratio (SNR) of measurements of light passing through the distal surface, facilitating the ability to test thinner process film layers 309 within the processing chamber 303. Transparent thin film 307 also passivates and protects the material of transparent window 120 in embodiments, allowing the costly transparent window 120 to last longer in the corrosive processing environment of processing chamber 303.

In some embodiments, a process film layer 309 (e.g., process thin film layer) is deposited during processing within the processing chamber 303. The process film layer 309 may include a single film or a film stack that is to be measured by spectrometer 225. The light coupling device 204 may collimate the light provided by the light source 201 and direct collimated light 304A through the proximal surface 120A of the transparent window 120, e.g., the outer surface of the flange 305. This incoming light is then reflected off of the distal surface 120B of the transparent window, e.g., of the shaft 301, off of the surface of the transparent thin film 307, and off a surface of the process film layer 309. These three sources of reflected light come back together, illustrated as reflected light 304B, and enter back into the light coupling device 204. The light coupling device 204 may focus the reflected light into the coupler 232 for entry into the spectrometer for measurement (see FIG. 2). In some embodiments, additional reflections may be collected and/or accounted for in analysis, e.g., reflection from proximal surface 120A, reflection from the interface of flange 305 and shaft 301, etc. In some embodiments, one or more reflections may be mitigated or eliminated. For example, reflection from surface 120A may be mitigated by application of an anti-reflective coating, design and/or construction of transparent window 120 may eliminate the optical interface between flange 305 and shaft 301, etc.

The return light signals at each interface (e.g., the above-mentioned surfaces that may reflect light) may all combine optically resulting in constructive and destructive interference. The exact nature of this interference depends on the relative thickness of each layer, e.g., the transparent window 120, the transparent thin film 307, and the process film layer 309 (or film stack). The final result measured by the spectrometer 225 (and after normalizing to an initial reference) may comprise a spectrum with interference fringes. These fringes may be fit with a mathematical optical thin film model, which can then determine one or more thin film optical parameters of the process film layer 309 such as thickness (e.g., optical thickness), n, and k values. The n and k values may be used to determine a composition of the process film layer 309 (e.g., of the material deposited on the walls of the process chamber). Knowing the exact initial thickness and optical properties of the transparent thin film 307 contributes to fitting of the spectra to the thin film model. The thickness of the process film layer 309 may be incorporated into computation of a dimensionless value, in view of which updates to a process operation (e.g., a cleaning operation, a deposition operation, an etch operation, etc.) may be made.

Figure 4:
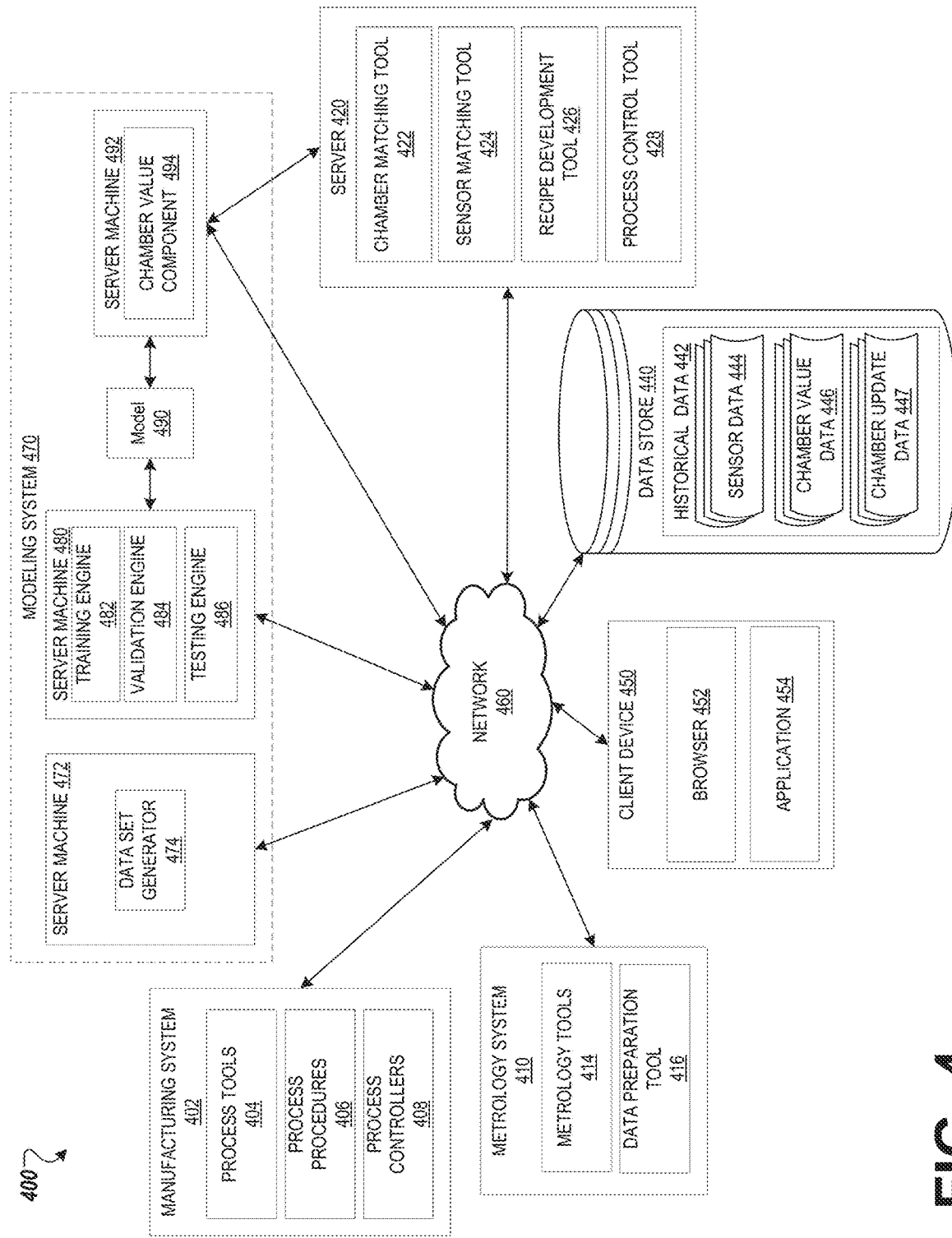
FIG. 4 is a block diagram illustrating an exemplary system architecture in which implementations of the disclosure may operate.

FIG. 4 is a block diagram illustrating an exemplary system architecture in which implementations of the disclosure may operate. As shown in FIG. 4, system architecture 400 includes a manufacturing system 402, a metrology system 410, a client device 450, a data store 440, a server 420, and a modeling system 470. The modeling system 470 may be part of the server 420. In some embodiments, one or more components of the modeling system 470 may be fully or partially integrated into client device 450. The manufacturing system 402, the metrology system 410, the client device 450, the data store 440, the server 420, and the modeling system 470 can each be hosted by one or more computing devices including server computers, desktop computers, laptop computers, tablet computers, notebook computers, personal digital assistants (PDAs), mobile communication devices, cell phones, hand-held computers, or similar computing devices.

The manufacturing system 402, the metrology system 410, client device 450, data store 440, server 420, and modeling system 470 may be coupled to each other via a network 460 (e.g., for performing methodology described herein). In some embodiments, network 460 is a private network that provides each element of system architecture 400 with access to each other and other privately available computing devices. Network 460 may include one or more wide area networks (WANs), local area networks (LANs), wired network (e.g., Ethernet network), wireless networks (e.g., an 802.11 network or a Wi-Fi network), cellular network (e.g., a Long Term Evolution (LTE) network), routers, hubs, switches, server computers, and/or any combination thereof. In some embodiments, processing and/or data storage operations may be performed by remote cloud-based devices, virtual devices, etc., and network 460 may enable access to and communication with these devices. Alternatively or additionally, any of the elements of the system architecture 400 can be integrated together or otherwise coupled without the use of network 460.

Client device 450 may be or include any personal computers (PCs), laptops, mobile phones, tablet computers, netbook computers, network connected televisions ("smart TV"), network-connected media players (e.g., Blue-ray player), a set-top-box, over-the-top (OOT) streaming devices, operator boxes, etc. The client device 450 may include a browser 452, an application 454, and/or other tools as described and performed by other systems of the system architecture 400. In some embodiments, the client device 450 may be capable of accessing the manufacturing system 402, the metrology system 410, the data store 440, server 420, and/or modeling system 470 and communicating (e.g., transmitting and/or receiving) indications of sensor data, processed data, data classifications, process result data, process update data, and/or inputs and outputs of various process tools (e.g., metrology tool 414, data preparation tool 416, chamber matching tool 422, sensor matching tool 424, recipe development tool 426, process control tool 428, and/or chamber value component 494) at various stages processing of the system architecture 400, as described herein.

As shown in FIG. 4, manufacturing system 402 includes process tools 404, process procedures 406, and process controllers 408. A process controller 408 may coordinate operation of process tools 404 to perform on one or more process procedures 406. For example, various process tools 404 may include specialized chambers such as etch chambers, deposition chambers (including chambers for atomic layer deposition, chemical vapor deposition, or plasma enhanced versions thereof), anneal chambers, and/or the like. In another example, machines may incorporate sample transportation systems (e.g., a selective compliance assembly robot arm (SCARA) robot, transfer chambers, front opening pods (FOUPs), side storage pod (SSP), and/or the like) to transport a sample between machines and process steps.

Process procedures 406, or sometimes referred to as process recipes, process operations, or process steps, may include various specifications for carrying out operations by the process tools 404. For example, a process procedure 406 may include process specifications such as duration of activation of a process operation, the process tool used for the operation, the temperature, flow, pressure, etc. of a machine (e.g., a chamber), order of deposition, and the like. In another example, process procedures may include transferring instructions for transporting a sample to a further process step or to be measured by metrology system 410. One or more process procedures 406 includes preventive maintenance procedures, cleaning procedures, conditioning procedures, seasoning procedures, etc.

Process controllers 408 can include devices designed to manage and/or coordinate the actions of process tools 404. In some embodiments, process controllers 408 are associated with a process recipe or series of process procedure instructions that when applied in a designed manner result in a desired process result of a substrate process. For example, a process recipe may be associated with processing a substrate to produce a target process result (e.g., critical dimension, thickness, uniformity criteria, etc.). Process controllers 408 can coordinate the performance of preventive maintenance procedures (e.g., chamber cleaning), chamber recovery procedures (e.g., chamber seasoning), and so on to return a chamber into a production state, and/or an update to a process operation associated with the processing chamber. Additionally, process controllers 408 can cause an update to a calibration of sensors associated with process tools 404 or metrology system 410.

As shown in FIG. 4, metrology system 410 includes metrology tools 414 and data preparation tool 416. Metrology tools 414 can include a variety of sensors to measure process results (e.g., critical dimension, thickness, uniformity, etc.) and detect parameters within the manufacturing system 402. In some embodiments, metrology tools 414 includes one or more optical sensors as described in FIGS. 2-3. In some embodiments, metrology tools 414 includes a sensor to measure a thickness of material on an inner surface of a processing chamber. Metrology tools 414 may include tools for performing in-line metrology, and may include an OWPS. Metrology tools 414 may include multiple sensors to detect conditions of the environment of the processing chamber. For example, sensors disposed within one or more processing chambers can be used to measure a condition within the processing chamber such as temperature, pressure, vacuum conditions, deposition layer thickness, and the like. In another example, sensors disposed within a processing chamber can be used to measure a thickness of a process product deposited along a surface of a wall of the processing chamber. Metrology tools 414 may also include devices to measure process results of substrates processed using the manufacturing system. For example, process results such as critical dimensions, thickness measurements (e.g., film layers from etches, depositing, etc.) can be evaluated of substrates processed according to process recipe and/or actions performed by process controllers 408. In another example, the variety of sensors can measure conditions of a chamber over a process operation.

Data preparation tool 416 may include process methodology to extract features and/or generate synthetic/engineered data associated with data measured by metrology tools 414. In some embodiments, data preparation tool 416 can identify correlations, patterns, and/or abnormalities of metrology and/or process performance data. For example, data preparation tool 416 may perform a feature extraction where data preparation tool 416 uses combinations of measured data to determine whether a criterion is satisfied. For example, data preparation tool 416 may analyze multiple data points of an associated parameter (e.g., temperature, pressure, deposition layer thickness, vacuum conditions, plasma conditions, process product thickness, etc.) to determine whether rapid changes occurred during an iteration of a process operation. In some embodiments, data preparation tool 416 performs a normalization across the various sensor data associated with various process chamber conditions. A normalization may include processing the incoming sensor data to appear similar across the various chambers and sensors used to acquire the data. Data preparation tool 416 may create a dimensionless value based on data collected by metrology tools 414. Specifically, data preparation tool 416 may determine a dimensionless value corresponding to a characteristic (e.g., thickness) of a process product film layer deposited on a surface of a wall of a processing chamber.

In some embodiments, data preparation tool 416 can perform one or more of a process control analysis, univariate limit violation analysis, or a multivariate limit violation analysis on metrology data (e.g., obtained by metrology tools 414). For example, data preparation tool 416 can perform statistical process control (SPC) by employing statistics based methodology to monitor and control process controllers 408. For example, SPC can promote efficiency and accuracy of a process operation (e.g., by identifying data points that fall within and/or outside control limits).

In some embodiments, a state of a processing chamber can be measured throughout a process operation. For example, a thickness of a process product deposited on an interior wall of the processing chamber during a process operation (e.g., during a process recipe operation, during a cleaning operation, etc.) can be measured. In some embodiments, increased amounts of metrology data is taken during predetermined processing operations. For example, during or immediately after a wafer is processed, additional sensors can be activated and/or a currently activated sensor may take additional data. In some embodiments, process controllers 408 may trigger measurement by metrology tools 414 based on operations to be performed by process tools 404. For example, process controllers 408 can trigger activation of one or more sensors (e.g. of metrology tools 414) responsive to an update of one or more parameters associated with a process. In another example, process controller 408 can trigger activation of an OWPS to measure optical properties of a process film layer which may be indicative of a thickness of the process film layer on an inner surface of a wall of a processing chamber.

In some embodiments, the extracted features, generated synthetic/engineered data, and statistical analysis can be used in association with modeling system 470 (e.g., to train, validate, and/or test model 490). Additionally and/or alternatively, data preparation tool 416 can output data to server 420 to be used by any of chamber matching tool 422, sensor matching tool 424, recipe development tool 426, and/or process control tool 428.

Data store 440 may be a memory (e.g., random access memory), a drive (e.g., a hard drive, a flash drive), a database system, or another type of component or device capable of storing data. Data store 440 may store one or more historical data 442 including historical sensor data 444, historical chamber value data 446, and/or historical chamber update data 447 of prior chamber conditions and process results of substrates processed in the associated chamber conditions. In some embodiments, historical chamber value data 446 includes historical normalized chamber value data. In some embodiments, historical sensor data 444 includes historical data from an OWPS. Historical sensor data 444 may include optical spectral data indicative of a thickness of a process film layer deposited along an inner surface of a wall of a processing chamber. In some embodiments, historical chamber update data 447 may include historical updates to one or more process operations associated with a processing chamber. For example, historical chamber update data 447 may include historical updates made to one or more process operations associated with a processing chamber (e.g., cleaning recipe updates, etch recipe updates, deposition recipe updates, etc.) that were made based on historical chamber value data 446. In some embodiments, historical chamber update data 447 may be mapped to historical chamber value data 446. In some embodiments, the historical data 442 may be used to train, validate, and/or test model 490 of modeling system 470 (see e.g., FIG. 8 for exemplary methodology).

Server 420 may include one or more computing devices such as a rackmount server, a router computer, a server computer, a personal computer, a mainframe computer, a laptop computer, a tablet computer, a desktop computer, etc. The server 420 may include a chamber matching tool 422, a sensor matching tool 424, a recipe development tool 426, and a process control tool 428.

Each of the chamber matching tool 422, the sensor matching tool 424, the recipe development tool 426, and the process control tool 428 may receive data from data preparation tool 416. Each of chamber matching tool 422, sensor matching tool 424, recipe development tool 426, and process control tool 428 may receive chamber value data from data preparation tool 416. The chamber value data may be associated with a condition of the processing chamber. In some embodiments, the chamber value data is indicative of a thickness of a process product deposited on an interior surface of a processing chamber. The chamber value data may correspond to an amount or characteristics of a process product deposited along an inner surface of a wall of a processing chamber. The chamber value data may indicate a net gain or loss of thickness of a film of a process product added to or removed from an inner surface of the processing chamber during a process operation (e.g., a cleaning operation, a deposition operation, an etch operation, etc.).

In some embodiments, each of chamber matching tool 422, sensor matching tool 424, recipe development tool 426, and process control tool 428 receives chamber data from process tools 404, and/or processed data output from data preparation tool 416. In some embodiments, data preparation tool 416 receives raw sensor data from metrology tool 414. The raw sensor data may be combined with synthetic data engineered from data preparation tool 416. Each of the chamber matching tool 422, the sensor matching tool 424, the recipe development tool 426, and the process control tool 428 may generate an update to one or more process procedures 406 and/or may generate reports/notifications indicative of chamber matching, chamber drift, anomalies, and so on. The update and/or report or notification may be based on the chamber value data.

In an example, chamber matching tool 422 may determine an update to a process operation of a first process chamber based on the chamber value data to cause the process operation performed on the first process chamber to more closely match a corresponding process operation performed on a second process chamber. Further details of chamber matching tool 422 are discussed with reference to process 600C of FIG. 6C.

In another example, sensor matching tool 424 may determine a calibration of one or more sensors associated with a processing chamber based on the chamber value data. Additionally, sensor matching tool 424 may determine a sensor calibration that accounts for sensor drift based on the chamber value data. Further details of sensor matching tool 424 are discussed with reference to process 600B of FIG. 6B.

In a further example, recipe development tool 426 may determine an update to a process recipe based on the chamber value data. Specifically, recipe development tool 426 may determine an update to one or more process parameters (e.g., run time, clean time, process knobs, etc.) to optimize a process recipe (e.g., process operation) based on the chamber value data. In one embodiment, recipe development tool 426 determines an update to a cleaning recipe that is periodically performed to clean a process chamber based on the chamber value data. Further details, in one example, of recipe development tool 426 are discussed with reference to process 600A of FIG. 6A.

As an additional example, process control tool 428 may determine an update to an endpoint of a process operation (e.g., an endpoint of a chamber cleaning operation) based on the chamber value data. Further details of process control tool 428 are discussed with reference to process 600D of FIG. 6D.

The updates to process procedures may alter a manner in which a process procedure 406 is implemented by process tools 404. For example, an update may include increasing or decreasing a process time of one or more process operations of a process procedure 406. For instance, the update may increase or decrease a duration of a chamber cleaning operation. In some embodiments, each of the chamber matching tool 422, the sensor matching tool 424, the recipe development tool 426, and the process control tool 428 may use a model (e.g., a model of modeling system 470) that receives input data such as chamber data from process tools 404, and/or processed data output from data preparation tool 416, and outputs one or more updates to process procedures 406. As will be discussed later, the model may be a machine learning model and may include a bootstrap aggregation model, a random forest tree decision tree model, a partial least squares regression (PLS) model, a least absolute shrinkage and selection operator (LASSO) regression model, and/or Ridge regression model among other models. The model may include ensemble modeling comprising multiple models (e.g., stacked modeling) and leveraging higher confidence models for final classification of the received data. Additionally, the model may include a linear model, a dynamic model, a digital model, a mechanistic model, a statistical model, a physics-based model, a digital twin model, etc.

As previously described, in some embodiments, of each of the chamber matching tool 422, the sensor matching tool 424, the recipe development tool 426, and/or the process control tool 428 may perform their described methodology using a machine learning model. In some embodiments, of each of the chamber matching tool 422, the sensor matching tool 424, the recipe development tool 426, and/or the process control tool 428 may perform their described methodology using a conventional model and/or a physics-based model (e.g., a digital twin). The associated models may be generated (e.g., trained, validated, and/or tested) using modeling system 470. The following exemplary description of modeling system 470 will be described in the context using modeling system 470 to generate a model 490 associated with chamber matching tool 422. However, it should be noted that this description is purely exemplary. Analogous processing hierarchy and methodology can be used in the generation and execution of models associated with each of the chamber matching tool 422, the sensor matching tool 424, the recipe development tool 426, and/or the process control tool 428 individually and/or in combination with each other, as will be discussed further in association with other embodiments.

Modeling system 470 may include one or more computing devices such as a rackmount server, a router computer, a server computer, a personal computer, a mainframe computer, a laptop computer, a tablet computer, a desktop computer, etc. The modeling system 470 may include a chamber value component 494. In some embodiments, the chamber value component 494 may use historical data 442 to determine an update based on the chamber value data (e.g. an update to one or more process parameters of a process procedure (e.g., process procedures 406)). In some embodiments, the chamber value component 494 may use a model 490 to determine the update. In certain embodiments, model 490 is a trained machine learning model. The model 490 may use historical data to determine the update.

In some embodiments, model 490 is stored on server machine 492 and/or server 420. Server machine 480 and/or server machine 492 may store one or more machine learning models recently trained (e.g., to perform model performance management). For example, one or more models trained within a duration of time (e.g., last 6 months) may be stored in server machine 492 and one or more final models for predicting chamber conditions may be stored on server 420 (e.g., operable with chamber matching tool 422).

In some embodiments, modeling system 470 further includes server machine 472 and server machine 480. Server machines 472 and 480 may be one or more computing devices (such as a rackmount server, a router computer, a server computer, a personal computer, a mainframe computer, a laptop computer, a tablet computer, a desktop computer, etc.), data stores (e.g., hard disks, memories databases), networks, software components, or hardware components.

Server machine 472 may include a data set generator 474 that is capable of generating data sets (e.g., a set of data inputs and a set of target outputs) to train, validate, or test a model. The data set generator 474 may partition the historical data 442 into a training set (e.g., sixty percent of the historical data, or any other portion of the historical data), a validating set (e.g., twenty percent of the historical data, or some other portion of the historical data), and a testing set (e.g., twenty percent of the historical data). In some embodiments, the chamber value component 494 generates multiple sets of training data. For example, one or more sets of training data may include each of the data sets (e.g., a training set, a validation set, and a testing set).

Server machine 480 includes a training engine 482, a validation engine 484, and a testing engine 486. The training engine 482 may be capable of training model 490 using one or more historical sensor data 444, historical chamber value data 446, and/or historical chamber update data 447 of the historical data 442 (of the data store 440). In some embodiments, the model 490 may be trained using one or more outputs of the data preparation tool 416, the chamber matching tool 422, the sensor matching tool 424, the recipe development tool 426, and/or the process control tool 428. For example, the model 490 may be a hybrid machine learning model using sensor data and/or mechanistic features such as a feature extraction, mechanistic modeling and/or statistical modeling (e.g., using data preparation tool 416) The training engine 482 may generate multiple trained models 490, where each trained model 490 corresponds to a distinct set of features of each training set.

The validation engine 484 may determine an accuracy of each of the trained models 490 based on a corresponding set of features of each training set. The validation engine 484 may discard trained models 490 that have an accuracy that does not meet a threshold accuracy. The testing engine 486 may determine a trained model 490 that has the highest accuracy of all of the trained models based on the testing (and, optionally, validation) sets.

The model 490 may refer to the model that is created by the training engine 482 using a training set that includes data inputs and corresponding target output (historical results of processing chamber under parameters associated with the target inputs). Patterns in the data sets can be found that map the data input to the target output (e.g. identifying connections between portions of the sensor data and/or chamber value data, and chamber process updates), and the model 490 is provided mappings that captures these patterns. The model 490 may use one or more of logistic regression, syntax analysis, decision tree, or support vector machine (SVM). In some embodiments, machine learning may be composed of a single level of linear or non-linear operations (e.g., SVM) and/or may be or include a neural network.

Chamber value component 494 may provide current data (e.g., current sensor data indicative of a thickness of a material on an inner surface of a processing chamber) as input to model 490 and may run model 490 on the input to obtain one or more outputs including a set of values indicating an update to one or more process procedures 406.

For purpose of illustration, rather than limitation, aspects of the disclosure describe the training of a model and use of a model using information pertaining to historical data 442. In other implementations, a heuristic model or rule-based model may be used to determine a process operation update.

In some embodiments, the functions of client devices 450, server 420, data store 440, and modeling system 470 may be provided by a fewer number of machines than shown in FIG. 4. For example, in some embodiments, server machines 472 and 480 may be integrated into a single machine, while in some other embodiments, server machine 472, 480, and 492 may be integrated into a single machine. In some embodiments, the modeling system 470 may be fully or partially provided by server 420.

In general, functions described in one embodiment as being performed by client device 450, data store 440, metrology system 410, manufacturing system 402, and modeling system 470 can also be performed on server 420 in other embodiments, if appropriate. In addition, the functionality attributed to a particular component can be performed by different or multiple components operating together.

In some embodiments, a "user" may be represented as a single individual. However, other embodiments of the disclosure encompass a "user" being an entity controlled by multiple users and/or an automated source. For example, a set of individual users federated as a group of administrators may be considered a "user."

Figure 5A:
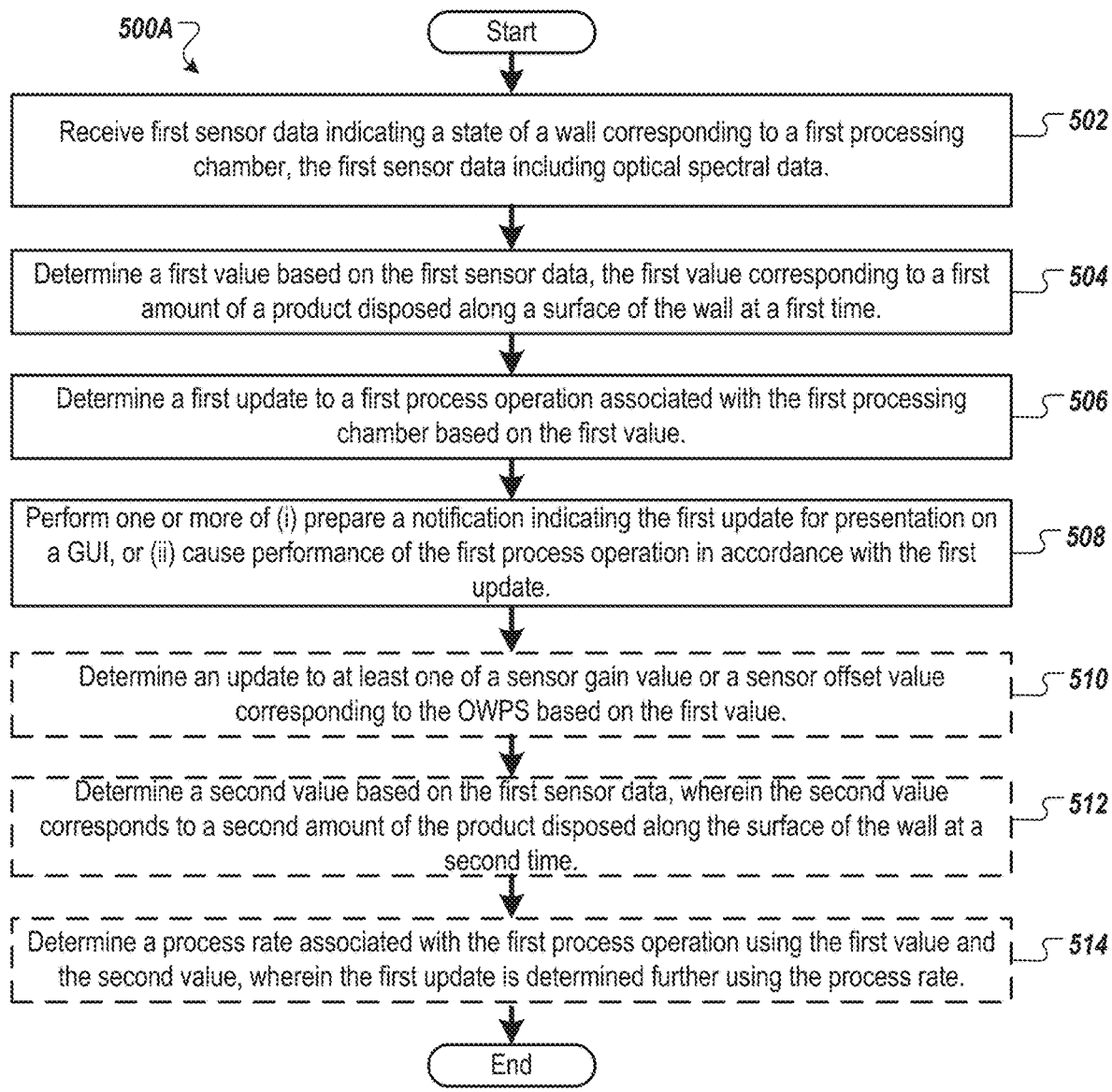
FIG. 5A is a flow diagram of a method for determining a process operation updated based on a chamber wall value, according to some embodiments.

FIGS. 5A-E are flow diagrams of methods 500A-E associated with using an optical sensor for processing chambers. FIG. 5A is a flow diagram of a method 500A for determining a process operation update based on a chamber wall value, according to some embodiments. Methods 500A-E may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, methods 500A-E may be performed, in part, by modeling system 470 of FIG. 4 (e.g., server machine 472, server machine 480, and server machine 492 of FIG. 4). Modeling system 470 may use method 500A to generate a data set to at least one of train, validate, or test a machine learning model, in accordance with embodiments of the disclosure. Methods 500A-E may be performed by server machine 480 (e.g., training engine 482, etc.). Methods 500A-E may be performed by server machine 492 (e.g., chamber value component 494). In some embodiments, methods 500A-E may be performed by server 420 (e.g., one or more of chamber matching tool 422, sensor matching tool 424, recipe development tool 426, and/or process control tool 428). In some embodiments, a non-transitory storage medium stores instructions that when executed by a processing device (e.g., of modeling system 470, of server machine 480, of server machine 492, of server 420, etc.) cause the processing device to perform methods 500A-E.

For simplicity of explanation, methods 500A-E are depicted and described as a series of operations. However, operations in accordance with this disclosure can occur in various orders and/or concurrently and with other operations not presented and described herein. Furthermore, not all illustrated operations may be performed to implement methods 500A-E in accordance with the disclosed subject matter. In addition, those skilled in the art will understand and appreciate that methods 500A-E could alternatively be represented as a series of interrelated states via a state diagram or events.

Referring to FIG. 5A, at block 502 of method 500A, a processing device may receive first sensor data indicating a state of a wall corresponding to a first processing chamber. The wall may be an interior wall of the first processing chamber. In some embodiments, the wall is a liner of the first processing chamber. In some embodiments, the first sensor data includes optical spectral data indicative of a state of a wall of a first processing chamber. The optical spectral data may be from an OWPS. The optical spectral data may include thin-film interference data indicative of a thickness of a thin film deposited on the first processing chamber wall and/or of other characteristics of the thin film. In some embodiments, the sensor data is indicative of a thickness of a process film layer deposited on an interior wall (e.g., a liner) of a processing chamber. The process film layer may be a deposited by-product of a first process operation (e.g., a by-product of a deposition operation, an etch operation, etc.). The sensor data may be indicative of a condition (e.g., a cleanliness condition) of an interior of a processing chamber. For example, the sensor data indicative of a thickness of the process film layer on the first processing chamber wall may also be indicative of a thickness of the process film layer deposited on one or more other interior surfaces of the first processing chamber.

At block 504, the processing device may determine a first value based on the first sensor data. The first value may be a dimensionless value indicative of the thickness of the process film layer. In some embodiments, the first value is a first index indicative of a the thickness of the process film layer deposited on an interior wall of the first processing chamber at a first time. In some embodiments, the first value indicates a thickness of the process film layer. For example, the first value may correspond to a thickness of the process film layer deposited on the first processing chamber wall before the first process operation. In some embodiments, the first value may correspond to a first amount of a product (e.g., the process film layer) deposited along a surface of the wall. In some embodiments, the first value is indicative of trends of the thickness of the process film layer deposited on one or more interior surfaces of the first processing chamber. As an example, a larger first value may indicate a thicker process film layer, while a smaller first value may indicate a thinner process film layer. The first value may be further indicative of the state of the first processing chamber.

At block 506, the processing device may determine a first update to a first process operation associated with the first processing chamber based on the first value. In some embodiments, the first process operation is a process procedure (e.g., process procedure 406 of FIG. 4). In some embodiments, the first update may be an update to a duration of one or more of a cleaning recipe, a deposition recipe, or an etch recipe, etc. In some embodiments, the first update may be an update to a deposition rate or an etch rate associated with a deposition recipe or an etch recipe respectively. In some embodiments, the first update may be an update to a process knob of the first process operation. In some embodiments, the first update is made to more closely match a target process procedure (e.g., of process procedures 406 of FIG. 4). In some embodiments, the first update is a maintenance procedure (e.g., a preventive maintenance procedure, a reactive maintenance procedure, etc.). In some embodiments, the first update is carried out by a user (e.g., a replacement of a chamber component).

In some embodiments, a state of a chamber may be tracked using optical sensor data. In some embodiments, an index indicative of a state of a coating (e.g., CWI) may indicate a state of a chamber. In some embodiments, an index may be generated from data including optical sensor data, e.g., a chamber state index. Evolution of an index over time may indicate drifting or aging components, drifting chamber performance, etc.

In some embodiments, receiving and storing optical data (and/or data based on optical data) of a fleet of processing chambers may enable fleet-wide outlier detection, tool matching, consistency evaluation, etc. In some embodiments, target processing conditions may be the same across a fleet of chambers. Optical data may be used to homogenize processing conditions in separate chambers. In some embodiments, optical data from a fleet of chambers may be provided to a trained machine learning model, configured to detect outliers. Such a model may have features in common with a machine learning model configured to detect anomalies, as described above. In some embodiments, detecting an outlier chamber may include comparing optical data received from the chamber to historical optical data. In some embodiments, an outlier chamber may generate optical data in line with other chambers, but other data may differ (e.g., a clean procedure may be run for longer to achieve the same optical result). A corrective action may be initiated, e.g., scheduling maintenance, providing an alert to a user, etc.

In some embodiments, multivariate methods may be used, e.g., for anomaly detection, for flagging outliers, etc. In some embodiments, spectral data may be combined with other data (e.g., other senor data, such as pressure data, temperature data, etc. and/or wafer data, such as in-line or in-situ metrology data, etc.). In some embodiments, spectral data, one or more indices based on spectral data, metrology data, and/or sensor data may be supplied to a machine learning model. The machine learning model may be configured to receive as input data indicative of processing conditions, processing quality, chamber performance, etc., and generate as output an indication of whether the chamber is performing similarly to other chambers in a fleet (e.g., is not performing anomalously). In some embodiments, data based on spectral data may include operations performed on spectral data, e.g., a derivative of an index based on spectral data, a slope of a spectrum at a particular wavelength, an average or median value, etc.

At block 508, the processing device may prepare a notification indicating the first update for presentation on a GUI. In some embodiments, the notification is prepared to be viewed by a user (e.g., an engineer, an operator, a technician, etc.) via the GUI. At block 508, the processing device may cause performance of the first process operation in accordance with the first update. For example, the processing device may cause the first process operation to be run in accordance with the first update. As a specific example, the processing device may cause a cleaning operation to be executed by the processing chamber according to an updated duration.

Optionally, at block 510, the processing device may determine an update, based on the first value, to at least one of a sensor gain value or a sensor offset value corresponding to the OWPS. The processing device may determine a calibration value corresponding to the OWPS based on the first value. For example, the processing device may determine that sensor data from the OWPS has drifted over time based on the first value, and may determine an update to the OWPS gain value and/or offset value based on the first value. In some embodiments, the processing device may determine, based on the first value, an update to at least one of a sensor gain value or a sensor offset value corresponding to one or more sensors of the first processing chamber. The processing device may determine one or more calibration values for one or more sensors of the first processing chamber, based on the first value.

In some embodiments, a baselining procedure may be performed to identify and/or correct for optical sensor drift. A baselining procedure may be performed periodically, e.g., separated by a fixed amount of time, a fixed number of substrates processed, etc. In some embodiments, a baselining procedure may be performed with a target frequency. In some embodiments, properties of an optical sensor arrangement may change over time. For example, the transparent window of an OWPS sensor may erode, undergo compositional change, etc. Baselining may be performed to account for changes to the behavior of the sensor assembly. Baselining may be performed by generating spectral data in a clean, idling chamber, e.g., when a processing operation is not occurring. Baseline spectra may be used to zero spectra collected by the OWPS system during processing of substrates (e.g., by subtracting baseline spectra from collected spectra). Frequency of performance of baselining operations may be adjusted based on the intended use of a chamber, quality or performance of a chamber, service lifetime of a chamber (e.g., time since chamber installation, run hours since chamber installation, etc.), or the like. In some embodiments, a baseline measurement may be used to determine a baseline response of the optical sensor (e.g., response in the absence of processing material). Baseline data may be used to correct data received from the optical sensor.

Optionally, at block 512, the processing device may determine a second value based on the first sensor data. The second value may correspond to a second amount of the product disposed along a surface of the first processing chamber wall at a second time. For example, the second value may correspond to a thickness of the process film layer deposited on the first processing chamber wall after the first process operation. In a more specific example, the second value may correspond to a thickness of the process film layer after a cleaning operation. A difference of the first value and the second value may correspond to a net change in the process film layer thickness during the first process operation.

Optionally, at block 514, the processing device may determine a process rate associated with the first process operation. The processing device may determine the process rate using the first value and the second value. The processing device may determine the process rate using a difference between the first value and the second value, divided by the duration of the first process operation. The first update determined by the processing device may be further determined based on the process rate. As an example, a cleaning operation may be updated based on a cleaning rate (e.g., a process rate) determined based on a difference of a beginning thickness of the process film layer and an ending thickness of the process film layer divided by the duration of the cleaning operation. The first update may correspond to lengthening or shortening the cleaning operation duration based on the cleaning rate.

Figure 5B:
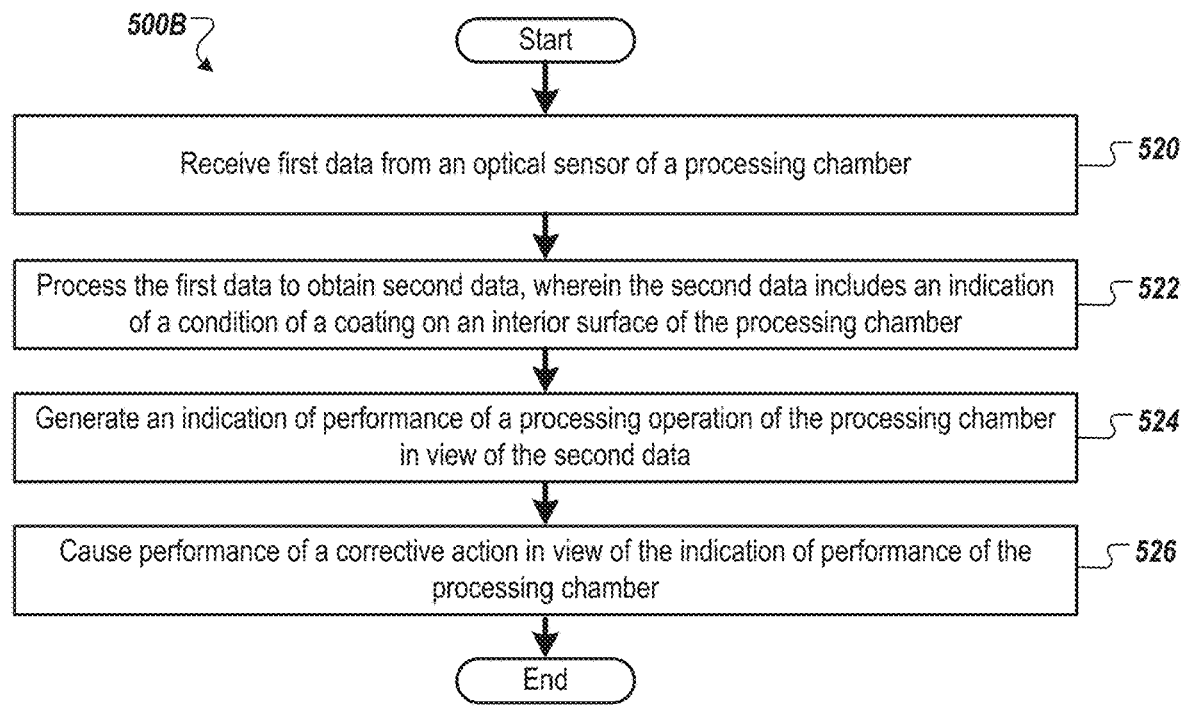
FIG. 5B is a flow diagram of a method for using optical sensor data in initiating performance of a corrective action, according to some embodiments.

FIG. 5B is a flow diagram of a method 500B for using optical sensor data in initiating performance of a corrective action, according to some embodiments. At block 520, processing logic receives first data from an optical sensor of a processing chamber. The optical sensor may be an OWPS sensor. The first data may include spectral data. The first data may be indicative of a coating on a surface of the OWPS sensor assembly (e.g., an a transparent window of the OSPS sensor assembly). In some embodiments, the first data may be generated by the optical sensor during a processing operation. In some embodiments, the first data may be generated between processing operations.

At block 522, processing logic processes the first data to obtain second data. The second data includes an indication of a condition of a coating on an interior surface of the processing in chamber. In some embodiments, the condition of the coating includes a thickness of the coating. In some embodiments, the second data includes a dimensionless parameter related to a condition of the coating, e.g., a CWI index. In some embodiments, the first data may be processed to account for optical effects, e.g., baseline drift, in-chamber plasma effects, etc. In some embodiments, a baseline response of the optical sensor assembly (e.g., OWPS) may be obtained. In some embodiments, baselining may include collecting optical data while the processing chamber is in an idle mode. In some embodiments, the effect of emissive plasma may be accounted for. In some embodiments, optical sensor data may be collected while a light source coupled to the optical sensor is turned off, and while plasma is being generated in the processing chamber. In some embodiments, plasma signal and baseline signal may be used to correct data received from the optical sensor, e.g., by baseline subtraction.

In some embodiments, data may be generated while the processing chamber is in a reference state, e.g., under conditions different from general processing conditions. Sensor data may be collected while the chamber is in a reference state to determine a reference sensor response. The reference sensor response may be utilized to correct or update the first and/or second data.

At block 524, processing logic generates an indication of performance of a processing operation of the processing chamber in view of the second data. In some embodiments, the indication of performance may be based on the value of a dimensionless index, e.g., a CWI index. In some embodiments, the processing operation may be an operation that deposits or removes material from a coating of a surface in the processing chamber, e.g., an etch operation, an atomic deposition operation, etc. In some embodiments, the processing operation may be a chamber cleaning operation. In some embodiments, generating an indication of performance of a processing operation may include providing data (e.g., spectral data, CWI data, etc.) to a trained machine learning model. A machine learning model may be trained using historical optical sensor data, e.g., as training input. The machine learning model may have been trained using supervised learning (e.g., provided with labeled training data, such as training data indicating quality classifications, anomaly classifications, historical anomaly label data, etc.). The machine learning model may have been trained using unsupervised learning (e.g., configured to perform clustering, anomaly detection, etc.).

At block 526, processing logic causes performance of a corrective action in view of the indication of performance of the processing chamber. In some embodiments, the corrective action may include one or more of providing an alert to a user (e.g., on a graphical user interface), updating a processing operation recipe (e.g., updating one or more steps or operations of an etch recipe, a cleaning recipe, or a deposition recipe), scheduling preventative maintenance, scheduling corrective maintenance, etc. In some embodiments, updating a recipe may include updating an endpoint of a processing operation, e.g., an operation may be extended if the time is determined to be insufficient, the operation may be shortened to increase chamber throughput, etc.

Figure 5C:
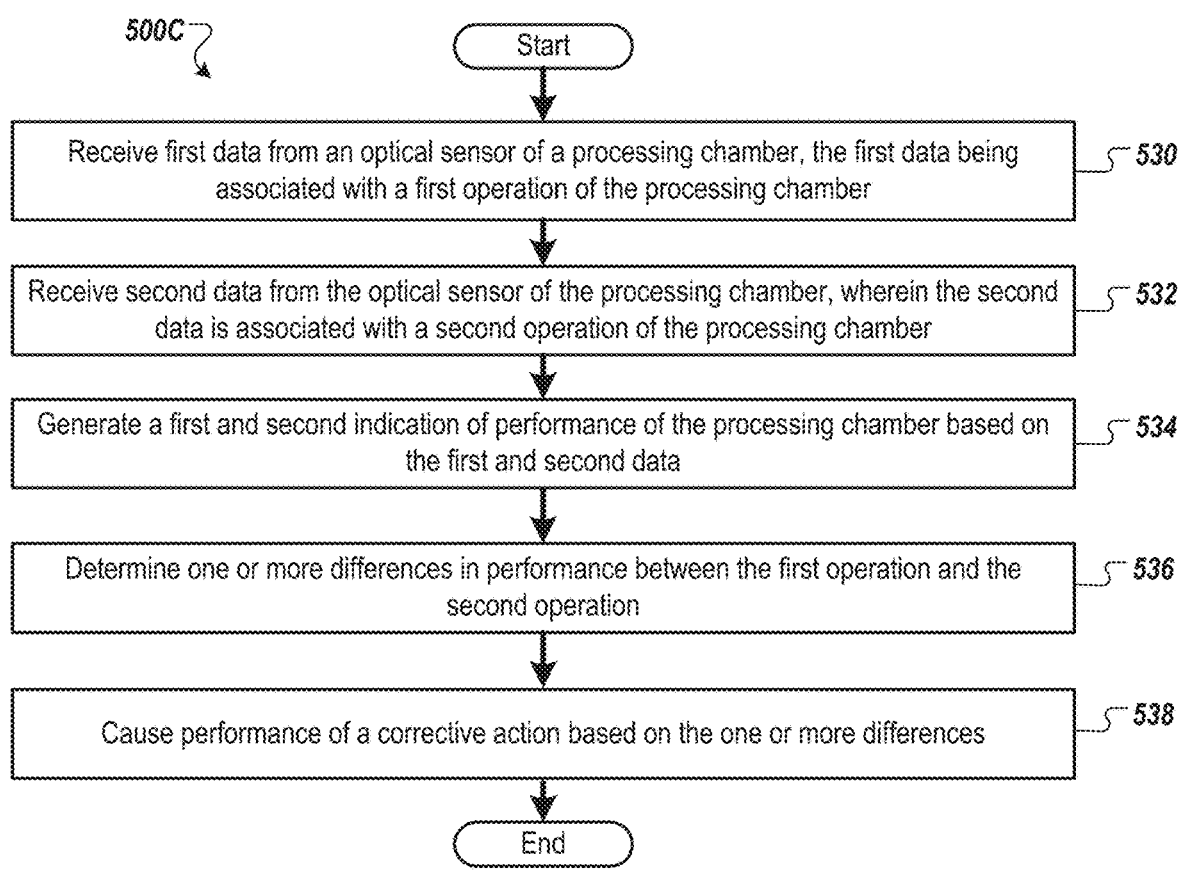
FIG. 5C is a flow diagram of a method for maintaining consistency of a processing chamber, according to some embodiments.

FIG. 5C is a flow diagram of a method 500C for maintaining consistency of a processing chamber, according to some embodiments. At block 530, processing logic receives first data from an optical sensor of a processing chamber. The first data is associated with a first operation of the processing chamber. In some embodiments the first operation is an operation that alters a condition of a coating on an interior surface of the chamber, e.g., a deposition or etch operation. In some embodiments, the operation is a cleaning operation, e.g., an in-situ chamber clean operation. In some embodiments, processing logic receives a plurality of historical data, e.g., the first data is one among many optical data associated with many operations. In some embodiments, first data comprises spectral data. In some embodiments, first data comprises an index, e.g., a CWI. In some embodiments, the first data is indicative of an evolution of spectral data throughout a processing operation, e.g., a time trace of CWI values, time trace spectral values, etc.

At block 532, processing logic receives second data from the optical sensor of the processing chamber. The second data is associated with a second operation of the processing chamber. In some embodiments, the second data is associated with a processing operation corresponding to the processing operation of the first data, e.g., the same operation of the same recipe, performed in separate runs, on separate wafers, etc. The second data may include similar features to the first data, e.g., may include spectral data, an evolution through time of data, etc.

At block 534, processing logic generates a first and second indication of performance of the processing chamber based on the first and second data. The first indication of performance may be associated with the performance of the first processing operation. The second indication of performance may be associated with the performance of the second processing operation. In some embodiments, the indications of performance may be generated by a machine learning model, e.g., the second data and/or the first data may be provided to a trained machine learning model that generates an indication of performance. In some embodiments, the machine learning model may be configured to detect outliers, anomalies, etc., based on optical sensor data.

At block 536, processing logic determines one or more differences in performance between the first operation and the second operation. In some embodiments, differences in performance may indicate drift in performance over time. In some embodiments, a plurality of historical performance data are considered. In some embodiments, evolution of performance over time may indicate a trend in performance, e.g., over may historical examples. In some embodiments, multi-variate analysis may be performed. Optical sensor data may be used along with other sensor data, manufacturing parameters, hardware data, metrology data, etc., to determine performance of a processing operation, performance of a chamber, performance drift over time, performance drift over chamber active hours, etc. At block 538, processing logic causes performance of a corrective action based on the one or more differences in performance data. Corrective actions may include updating a processing recipe, such as updating an endpoint condition of a processing recipe (e.g., an endpoint time, a target endpoint sensor reading, etc.). Corrective actions may include scheduling maintenance, e.g., scheduling replacement of a component, scheduling preventative maintenance, scheduling further investigations of a subsystem, etc. Corrective actions may include providing an alert to a user, e.g., via a user interface.

Figure 5D:
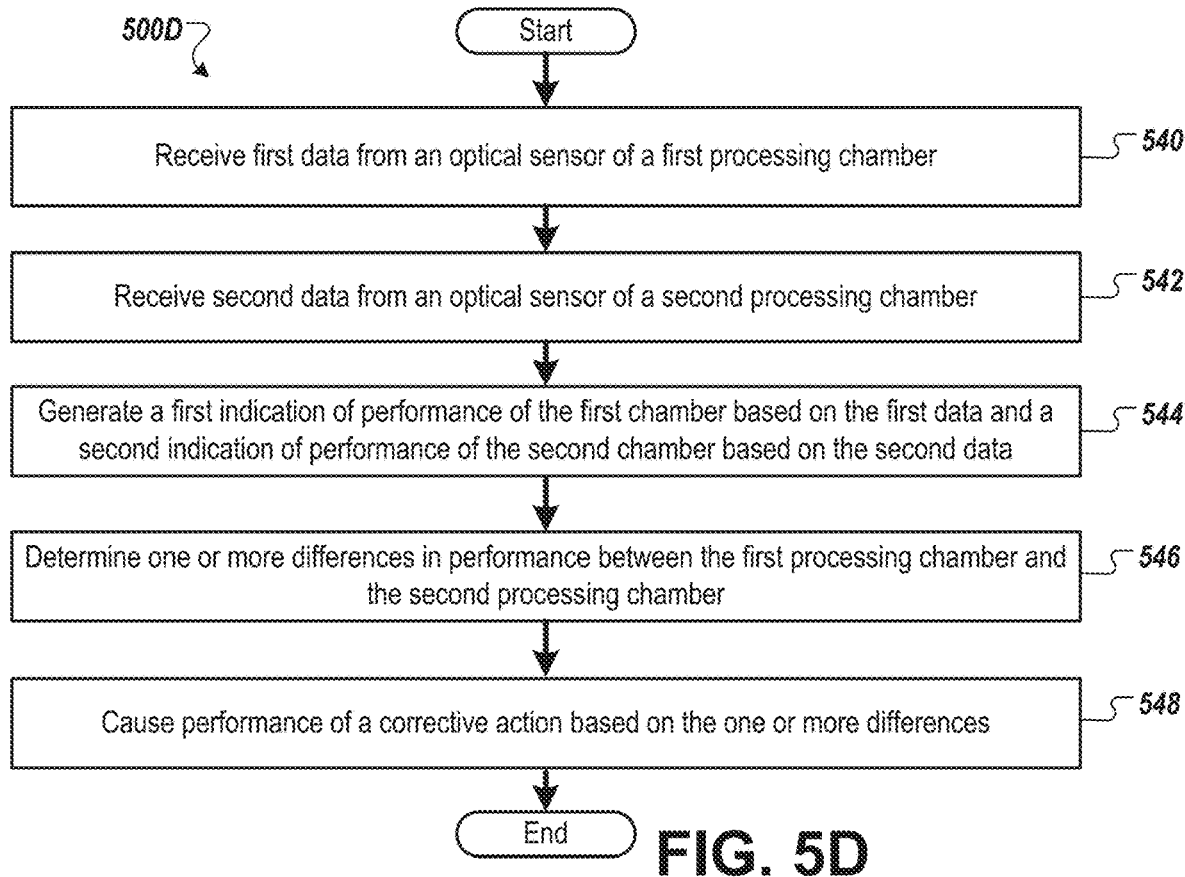
FIG. 5D is a flow diagram of a method for detecting and correcting anomalies and/or inconsistencies in a fleet of processing chambers, according to some embodiments.

FIG. 5D is a flow diagram of a method 500D for detecting and correcting anomalies and/or inconsistencies in a fleet of processing chambers, according to some embodiments. At block 540, processing logic receives first data from an optical sensor of a first processing chamber. First data may include spectral data. First data may include processed data, e.g., an index such as a CWI index. First data may be indicative of a character of a coating on an interior surface of a processing chamber, e.g., a thickness of the coating, a composition of the coating, etc. At block 542, processing logic receives second data from an optical sensor of a second processing chamber. The second data may share features with the first data.

At block 544, processing logic generates a first indication of performance of the first chamber based on the first data and a second indication of performance of the second chamber based on the second data. The indications of performance may include indices indicating a state of the chamber, e.g., dimensionless indices such as CWIs. The indications of performance may incorporate additional data, e.g., generation may include multi-variate analysis. In some embodiments, data indicative of optical conditions of a chamber (e.g., OWPS sensor data, data indicating thickness and/or composition of a deposited film inside the processing chamber, etc.) may be provided to a trained machine learning model to generate an indication of performance. In some embodiments, other sensor data, metrology data, processing parameter data, etc., may also be supplied to the machine learning model. The trained machine learning model may be configured to determine differences in performance, e.g., may be configured to detect outliers, anomalies, etc. In some embodiments, performance of a processing chamber may be compared to performance of a plurality of chambers, e.g., anomalous performance in a fleet of chambers may be identified. Performance of a processing chamber may be compared to historical data of a plurality of processing chambers.

At block 546, processing logic determines one or more differences in performance (e.g., quality of performance) between the first processing chamber and the second processing chamber. In some embodiments, operations of block 546 may be accomplished by providing data to a trained machine learning model. In some embodiments, operations of block 546 may be performed by comparing data of one processing chamber to an average, median, range, etc., of a plurality of other chambers (e.g., the plurality including the first processing chamber).

At block 548, processing logic causes performance of a corrective action based on the one or more differences between performance of the first processing chamber and the second processing chamber. In some embodiments, the corrective action may be selected to alter performance of the second processing chamber. In some embodiments, the corrective action may alter the performance of the second processing chamber such that the altered performance of the second processing chamber is more similar to the performance of the first processing chamber than the unaltered performance of the second processing chamber. In some embodiments, performance of the second chamber may be matched to the first chamber. The corrective action may include updating a process recipe. In some embodiments, the process recipe associated with the optical sensor data may be updated. For example, process time, processing temperature or pressure, gas flow, etc., may be adjusted to more closely align the performance of the second chamber to the performance of the first. In some embodiments, a process other than the process(es) associated with the optical sensor data may be updated. For example, a cleaning procedure recipe may be updated, and the updating cleaning procedure may affect performance of a processing recipe (e.g., a substrate processing procedure) of the second chamber.

Figure 5E:
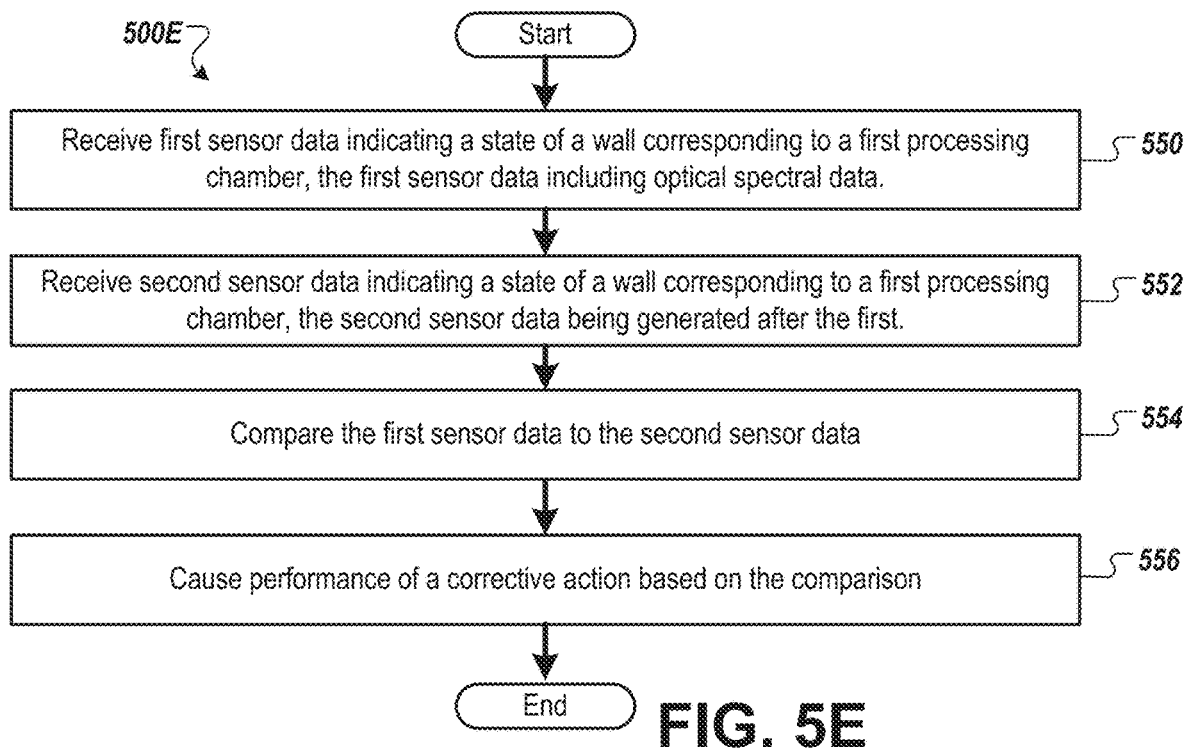
FIG. 5E is a flow diagram of a method for utilizing optical sensor data generated over time, according to some embodiments.

FIG. 5E is a flow diagram of a method 500E for utilizing optical sensor data collected over time, according to some embodiments. At block 550, processing logic receives first sensor data. The first sensor data includes optical data, e.g., data from an OWPS. The first data is indicative of a state of a wall of a first processing chamber. At block 552, processing logic receives second sensor data. The second sensor data may have similar features to the first sensor data. Operations of blocks 550 and 552 may share features with operations of block 502 of FIG. 5A.

At block 554, processing logic compares the first sensor data to the second sensor data. In some embodiments, the first sensor data may include historical sensor data. In some embodiments, a corrective action may be determined in view of historical data. Historical optical sensor data (e.g., spectral data generated by an OWPS) of many processing runs may be recorded and stored (e.g., as first sensor data). In some embodiments, historical data may be utilized that is collected from the same processing chamber, from processing runs executing the same recipe, from processing runs sharing a target final product, etc. Second sensor data (e.g., a current dimensionless value derived from OWPS sensor data) may be compared to historical optical sensor data. In some embodiments, a statistical analysis may be utilized for anomaly detection—e.g., it may be determined whether a dimensionless value associated with OWPS sensor data falls outside a threshold, such as three standard deviations from an average value of historical data. In some embodiments, a machine learning model may be trained using historical optical data (e.g., spectral data, parameters generated based on spectral data, etc.). The machine learning model may be configured to accept as input current data (e.g., spectral data indicative of a condition of a lining deposited on a chamber wall) and generate as output an indication of whether the processing run associated with the input data is likely to be anomalous (e.g., produce a product that doesn't meet a performance threshold, etc.). In some embodiments, the machine learning model may be trained via unsupervised learning (e.g., generated to determine if input data is similar to the historical data without explicit labeling). In some embodiments, the machine learning model may be trained using supervised learning (e.g., trained on data labeled with classification labels, such as labeling data as being associated with an acceptable product, labeling data with a specific anomaly cause for anomaly cause classification, etc.).

In some embodiments, data associated with an optical sensor may be monitored over time (e.g., over many substrates processed, over long chamber uptime, over long radio frequency hours, etc.). In some embodiments, optical data may be utilized to maintain run to run consistency, e.g., process parameters may be adjusted to compensate for drift, aging, etc., in processing equipment components. Run to run consistency operations may share features with anomaly detection operations described above, e.g., in connection with block 506 of FIG. 5A. Run to run consistency operations may include statistical calculations, providing current sensor data to a machine learning model, etc. In some embodiments, conditions of a chamber may be tracked over time, and process operations (e.g., process recipes) may be updated to maintain chamber consistency. In some embodiments, tracking changes to processing conditions, recipes (e.g., changes made to maintain consistent processing conditions), etc., may enable an understanding of chamber performance over time, upcoming maintenance to be performed, etc. In some embodiments, monitoring data from a chamber over time may include monitoring spectral data and/or monitoring index data, e.g., a value designed to represent a quality of a coating, chamber, etc., based on spectral data. In some embodiments, evaluating performance over time may include evaluating data generated at the end of a process, e.g., a wall index value (CWI value) related to the spectral data at the end of a process. In some embodiments, evaluating performance over time may include evaluating data generated throughout a process, e.g., evolution of wall index value throughout a process. In some embodiments, OWPS data may be utilized to determine if an update to a process recipe has had an intended effect, e.g., if the update corrected a processing fault. In some embodiments, one or more other value may be tracked over time, e.g., a derivative or slope of spectral data or an index value, higher derivatives, an average over time (e.g., over a processing operation), etc.

In some embodiments, data from several processing operations (e.g., processing runs performed over a period of time) may be analyzed. In some embodiments, data may be tracked over time (e.g., an index such as a CWI may be tracked over multiple processing runs). Performance of a process may be correlated to tracked optical data, e.g., etch rate may be correlated with CWI value. Drift may be detected in a chamber, in a process, in a fleet, etc., based on tracked optical data. Corrective actions may be taken in view of detected drift over time. For example, OWPS data may be generated during a cleaning procedure. OWPS data collected at the end of a cleaning procedure may be tracked over time (e.g., over a number of cleaning procedure runs). Drift may be detected in the OWPS data (e.g., by calculating the slope of indices associated with OWPS data plotted over time, by calculating the difference between index values over time, etc.). A process may be adjusted due to drift detection, e.g., a clean procedure endpoint may be adjusted. In some embodiments, a procedure may be adjusted to provide improved results, e.g., a cleaning procedure may be extended for a more thorough clean. In some embodiments, a procedure may be adjusted to provide improved efficiency, e.g., a cleaning procedure may be shortened to increase throughput, reduce expense, etc.

FIGS. 6A-D are flow diagrams of processes 600A-D associated with determining a process operation update based on chamber wall value, according to some embodiments. Processes 600A-D may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, processes 600A-D may be performed, in part, by modeling system 470 of FIG. 4 (e.g., server machine 472, server machine 480, and server machine 492 of FIG. 4). Processes 600A-D may be performed by server machine 480 (e.g., training engine 482, etc.). Processes 600A-D may be performed by server machine 492 (e.g., chamber value component 494). In some embodiments, processes 600A-D may be performed by server 420 (e.g., one or more of chamber matching tool 422, sensor matching tool 424, recipe development tool 426, and/or process control tool 428). In some embodiments, a non-transitory storage medium stores instructions that when executed by a processing device (e.g., of modeling system 470, of server machine 480, of server machine 492, of server 420, etc.) cause the processing device to perform processes 600A-D.

Figure 6A:
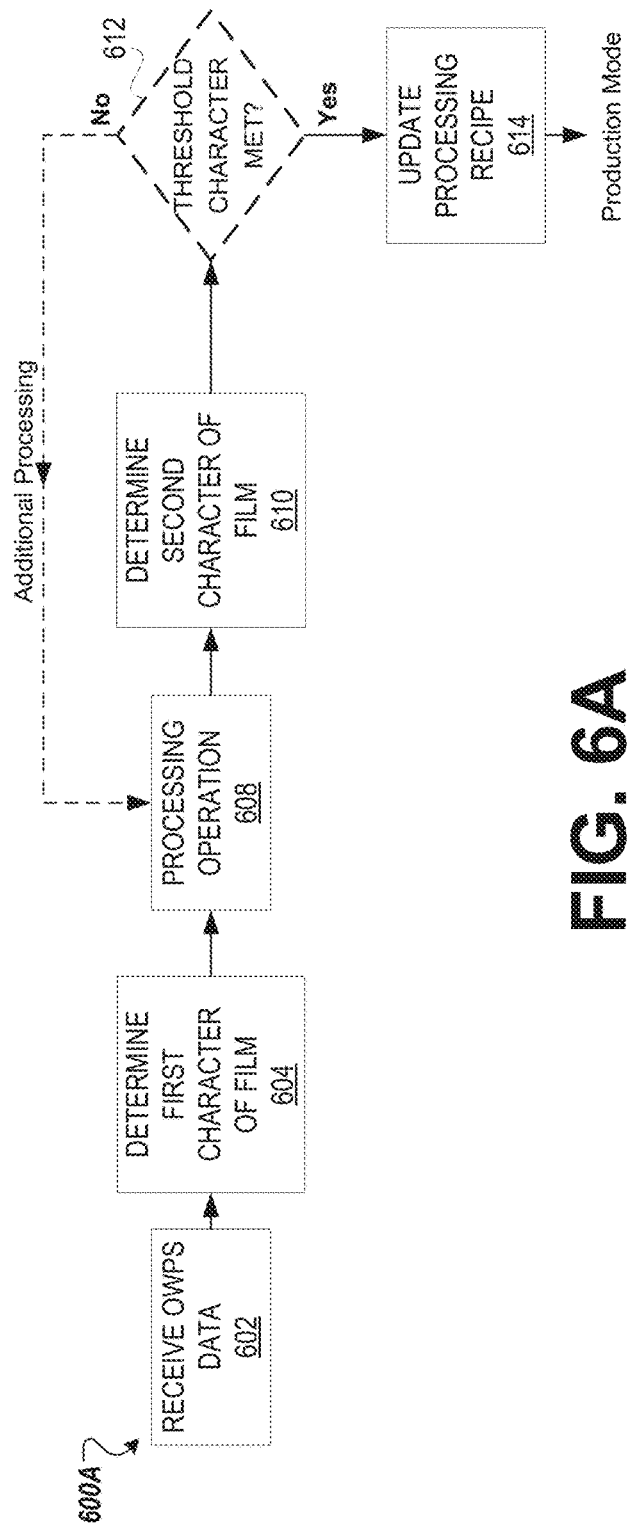
FIGS. 6A-D are flow diagrams of processes associated with determining a process operation update based on chamber wall value, according to some embodiments.

Referring to FIG. 6A, a process 600A for updating a chamber cleaning recipe is shown. Process 600A may be performed by recipe development tool 426 of FIG. 4. In some embodiments, at block 602, a processing device (e.g., of recipe development tool 426) may receive OWPS data. The OWPS data may be indicative of one or more optical thin-film properties of a process film layer deposited on an inner surface of a processing chamber wall (e.g., on a processing chamber liner). The OWPS data may be indicative of a thickness of a process film layer deposited on an inner wall (e.g., a liner) of a processing chamber. The processing device may determine a first character of a film deposited on the wall at block 604. In some embodiments, the processing device may determine a thickness of a film. In some embodiments, the processing device may determine a chemical composition of a film. In some embodiments, the processing device may determine a chemical arrangement or packing geometry (e.g., crystal structure, molecular or atomic packing structure, etc.) of a film. In some embodiments, the processing device may determine another property of the film. The processing device may determine the character of the process film layer before a process operation. The processing device may determine a first dimensionless value indicative of the process film layer character prior to a process operation. In some embodiments, the first dimensionless value may be determined prior to a chamber cleaning operation.

At block 608, the processing device may cause a processing operation to be initiated. In some embodiments, the processing operations initiated may comprise a cleaning process, an etch process, a deposition process, etc.

After the processing operation, at block 610, the processing device may determine a second character of the film on the processing chamber wall, e.g., a character of the film at a second time. The processing device may determine a second dimensionless value indicative of the process film layer character subsequent to the processing operation. The processing device may determine the second value based on sensor data received from the OWPS subsequent to the processing operation.

At block 612, the processing device may determine whether a threshold process layer character has been met. In some embodiments, the threshold process layer character comprises a critical wall thickness. In some embodiments, the threshold process layer character comprises a target chemical composition. The processing device may make the determination based on a comparison of the first dimensionless value and the second dimensionless value. As an example, the processing device may determine whether the processing chamber has been cleaned such that the thickness of the process film layer on the processing chamber wall is below a predetermined value (e.g., the critical wall thickness). If the threshold thickness has not been met, the processing device may cause additional chamber cleaning (block 608). If the threshold thickness has been met, the processing device may cause the cleaning recipe to be updated (e.g., based on any additional cleaning time, etc.) at block 614. After the cleaning process has been updated, the processing device may cause the processing chamber to be released to a production mode. Although operations of process 600A are described with reference to a chamber cleaning operation, it is to be understood by a person having ordinary skill in the art that process 600A can be applied to any chamber process operation, such as a deposition process, an etch process, etc.

Figure 6B:
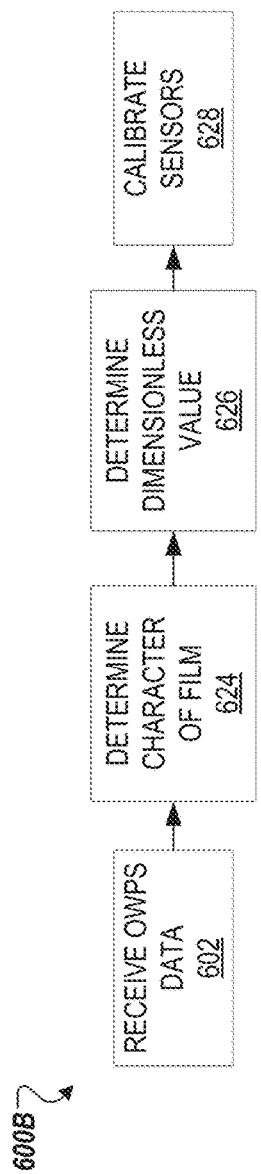

Referring to FIG. 6B, a process 600B for calibrating sensors of a processing chamber is shown. Process 600B may be performed by sensor matching tool 424 of FIG. 4. Process 600B may be performed to account for sensor drift over time. In some embodiments, at block 602, a processing device (e.g., of sensor matching tool 424 of FIG. 4) may receive OWPS data. The OWPS data may be indicative of one or more optical thin-film properties of a process film layer deposited on an inner surface of a processing chamber wall (e.g., on a processing chamber liner). The OWPS data may be indicative of a thickness of the process film layer, a chemical composition of the process film layer, etc. At block 624, the processing device may determine character of a film deposited on the processing chamber wall. The character may correspond to an amount of material deposited on the surface, a thickness of the film on the surface, a chemical composition of the film, or another characteristic of the film. In some embodiments, a thickness of a film may be determined from data indicated an amount of material deposited proximate to the sensor. The processing device may determine a dimensionless value indicative of the process film layer character at block 626. The processing device may use the dimensionless value to calibrate one or more sensors associated with the processing chamber at block 628. The one or more sensors may include an OWPS of the processing chamber, but may also include other sensors of the processing chamber, sensors associated with one or more other process chambers, etc. The calibration of a sensor may include baseline subtraction, percent response or another functional adjustment, parameter-dependent adjustment (e.g., wavelength dependent adjustment), etc. The calibration of the sensors by the processing device may be in response to sensor drift, and/or process drift caused by a buildup of the process film layer on one or more interior surfaces of the processing chamber.

Figure 6C:
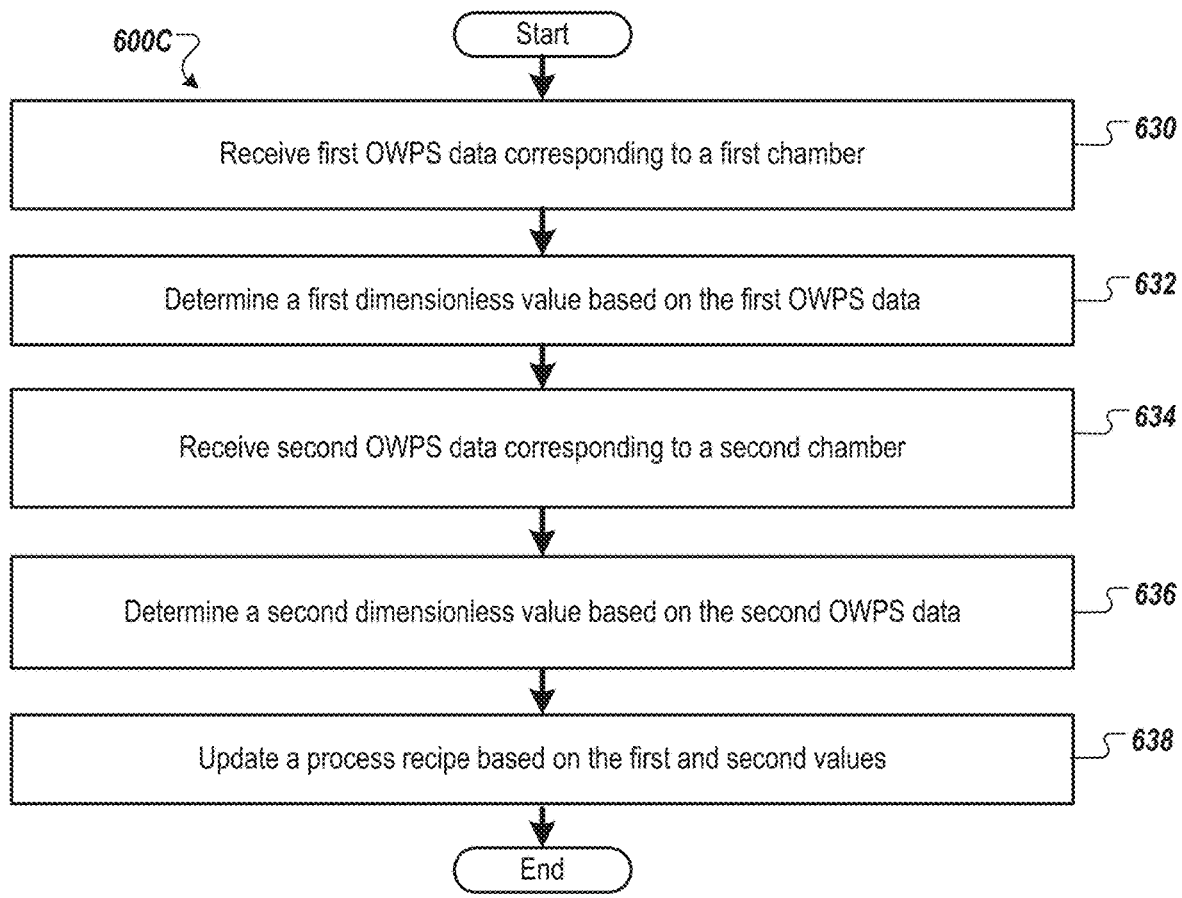

Referring to FIG. 6C, a process 600C for updating a chamber process recipe is shown. Process 600C may be performed by chamber matching tool 422 of FIG. 4. In some embodiments, at block 630, a processing device (e.g., of chamber matching tool 422 of FIG. 4) may receive first OWPS data corresponding to a first processing chamber. At block 632, the processing device may determine a first dimensionless value based on the first OWPS data. The first dimensionless value may be indicative of a process film layer character of a film deposited on an interior wall (or other interior surface) of the first processing chamber. At block 634, the processing device may receive second OWPS data corresponding to a second processing chamber. The processing device may determine a second dimensionless value based on the second OWPS data at block 636. The second dimensionless value may be indicative of a process film layer character of a film deposited on an interior wall of the second processing chamber. In some embodiments, the processing device may normalize the first dimensionless value and the second dimensionless value by a data normalization operation. The normalization of the first dimensionless value and the second dimensionless value may be based on process drift caused by a buildup of process material (e.g., an increase in thickness of the process film layer) in the first processing chamber and/or the second processing chamber.

At block 638, the processing device may update a process recipe (e.g., process procedures 406 of FIG. 4) associated with the first processing chamber based on the first dimensionless value and the second dimensionless value. In some embodiments, the processing device may update the process recipe based on the normalized first dimensionless value and/or the normalized second dimensionless value. Updating the process recipe associated with the first processing chamber based on the first and second dimensionless values may match or tune the first processing chamber to the second processing chamber. Updating the process recipe associated with the first processing chamber based on the first and second dimensionless values may be included in a chamber matching procedure for matching the first and second chambers. In some embodiments, process recipe set points may be adjusted, e.g., temperature, pressure, gas flow, etc. In some embodiments, process recipe operation durations may be adjusted, e.g., adjusting endpoints or transitions points.

Figure 6D:
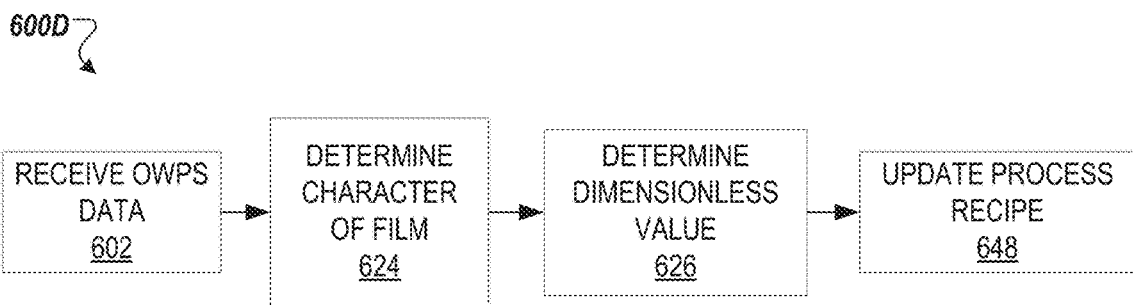

Referring to FIG. 6D, a process 600D for updating a chamber process recipe endpoint is shown. Process 600D may be performed by process control tool 428 of FIG. 4. In some embodiments, at block 602, a processing device (e.g., of process control tool 428 of FIG. 4) may receive OWPS data indicative of one or more optical thin-film properties of a process film layer deposited on an inner surface of a processing chamber wall (e.g., on a processing chamber liner). The OWPS data may be indicative of a thickness of the process film layer, a chemical composition of the process film layer, a structural or packing arrangement of the process film layer, etc.

At block 624, the processing device may determine character of a film deposited on the processing chamber wall. The determination may be based on the OWPS data. In some embodiments, the processing device determines a dimensionless value indicative of the thickness of the process film layer at block 626. The dimensionless value may be a ratio, a percentage, etc. of a target value of one or more characteristics of the thin film. In some embodiments, the dimensionless value may indicate a percentage thickness of an allowable thickness of the process film layer (e.g., of a critical wall thickness). The processing device may update a process operation recipe in view of the dimensionless value. The processing device may update a process recipe endpoint (e.g., a cleaning recipe endpoint, a deposition recipe endpoint, an etch recipe endpoint, etc.), one or more recipe processing parameters (e.g., temperature, pressure, gas flow, etc.), one or more hardware parameters (e.g., placement of internal components) at block 648 based on the dimensionless value. The process update to the process recipe may correlate to a target process recipe endpoint condition. For example, the update to the process recipe may correlate to the process recipe ending at a point where the process film layer thickness is at (e.g., above, or below) a predetermined value (e.g., the critical wall thickness). In some embodiments, the update to the process recipe causes the process recipe to end before the process film layer character reaches a critical value (e.g., before the film layer reaches the critical wall thickness). In some embodiments, the update to the process recipe causes the process recipe to end after the process film layer character falls below a critical value.

Figure 7:
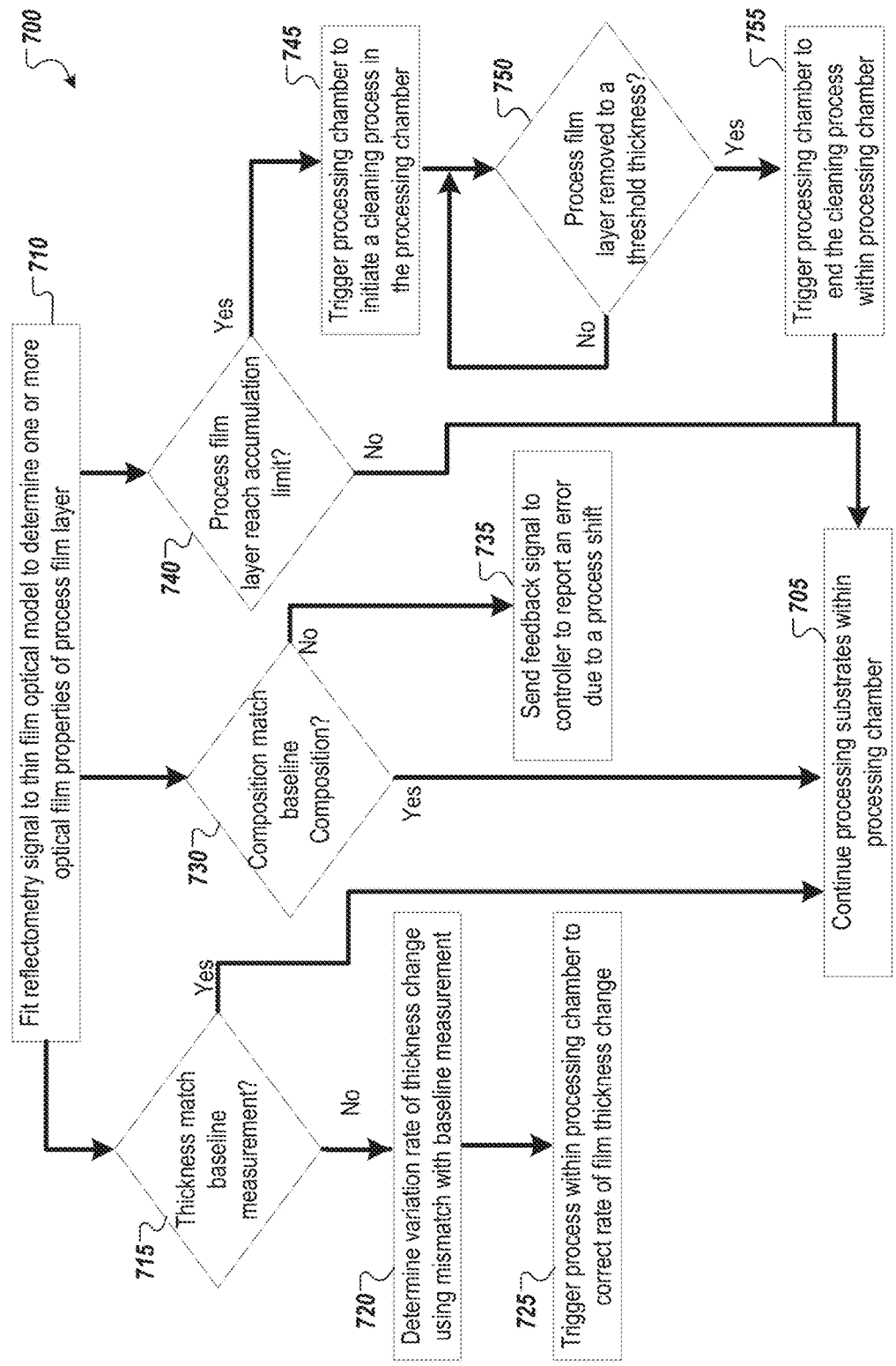
FIG. 7 is a flow chart of methods using one or more optical film property of the deposited thin film on the transparent thin film to improve the processing within the processing chamber, according to some embodiments.

FIG. 7 is a flow chart of methods 700 using one or more optical film properties of a process film layer on a wall of a process chamber (e.g., on a transparent thin film (e.g., transparent thin film 307 of FIG. 3) that overlies a transparent window (e.g., transparent window 120 of FIG. 1) to improve the processing within the processing chamber, according to various aspects of the disclosure. The method 700 may be performed by processing logic that may include hardware (circuitry, dedicated logic, etc.), software (such as is run on a general purpose computer system or a dedicated machine), firmware, or some combination thereof. For example, method 700 may be performed by the controller 109 (e.g., the processing device 130) as these components are referenced herein. In some embodiments, the various baselines or threshold values (such as variations in thickness or for n and k) may be stored and indexed against particular compositions within the memory 134 of the controller 109. These values may be used by way of comparison by the various methods 700 now discussed. Although shown in a particular sequence or order, unless otherwise specified, the order of the processes can be modified. Thus, the illustrated embodiments should be understood only as examples, and the illustrated processes may be performed in a different order, and some processes may be performed in parallel. Additionally, one or more processes can be omitted in various embodiments. Thus, not all processes are required in every embodiment. Other process flows are possible.

With reference to FIG. 7, the method 700 may begin at block 710 with the processing logic processing a reflectometry signal to fit the reflectometry signal to a thin film optical model to determine one or more film properties or characteristics (e.g., thickness, values for n and k, material composition, etc.) of the process film layer 309 deposited on the transparent thin film 307 (see FIG. 3). When measurements are taken during processing substrates within the processing chamber, method 700 may continue with the processing logic determining whether the property or characteristic such as thickness matches a baseline measurement for the process film layer, e.g., given the composition of the process film layer 309 at block 715. The processing logic may determine a dimensionless value indicative of the character of the process film layer (e.g., thickness) to match the character to a baseline, standard, or golden-run measurement (e.g., measurement associated with a processing run deemed of sufficiently high quality, performance, etc.). If there is a match, e.g. if one or more property or character values of the process film layer meet threshold values, method 700 may continue with processing substrates within the processing chamber at block 705. If there is not a match, method 700 may continue to block 720. At block 720, processing logic determines a variation in a rate of change of the value of one or more properties of the process film layer. The rate of change may not meet threshold performance metrics (e.g., a layer may be deposited too quickly or too slowly).

In various embodiments, the threshold variation (e.g., variation compared to a baseline measurement, standard measurement, golden-run measurement, average or median of several measurements, two-sigma variation from average, etc.) may be sufficient to merit a change in the processing operation, e.g., deposition process, etch process, cleaning process, etc. Any such threshold variation may be specific to the application, and may be empirically determined based on how much variation is adequate to induce a process shift. The process being monitored may be an etch process, deposition process, cleaning process, or the like.

Method 700 may continue to block 725 with the processing logic triggering a process within the processing chamber that is to correct the rate of deposition or removal of the process film layer. This portion of method 700 may, in this way, use differential measurements compared to a baseline measurement (e.g., golden run measurement, average of several measurements, etc.) over time to determine whether processes of the processing chamber have shifted (or drifted) over time. In some embodiments, a machine learning model may be utilized to identify anomalous variation in a rate of change of a film. In some embodiments, an unsupervised machine learning model may be configured to detect optical measurements (or optical measurement derivatives, dimensionless parameters, etc.) indicative of a processing fault, chamber drift or aging, component failure, etc.

Method 700 may similarly continue with the processing logic determining whether the material composition of the process film layer 309 matches a baseline composition expected to be deposited on the transparent thin film at block 730. If the measured composition matches the baseline composition (to within an acceptable error threshold), method 700 may continue to block 705 with continued processing of substrates within the processing chamber. If there is not a match, method 700 may continue to block 735 with the processing logic sending a feedback signal to the controller 109 (or other computing device with an interface to processing system operators) to report an error due to a process shift detected within the processing chamber. The process shift may be detected in comparing the detected composition to the expected composition, e.g., determining that the composition of the process film has drifted. This portion of method 700 may be performed while the processing system is inactive in some embodiments.

In some embodiments, method 700 may continue to block 740 with the processing device determining, during or after processing a substrate within the processing chamber, whether the process film layer has reached an accumulation limit (e.g., limit on accumulated thickness within specification). If not, methods 700 may continue with processing substrates within the processing chamber at block 705. If the thin process film has reached an accumulation limit, method 700 may continue with the processing logic triggering the processing chamber to initiate a cleaning process in the processing chamber at block 745. The processing device may determine whether the process film layer has reached the accumulation limit based on a dimensionless value indicative of the process film layer thickness. The cleaning process may be intended to clean the processing equipment and surfaces of built-up films in order to improve future processing results, and/or to return the processing equipment to a certain specification. The cleaning process may also use a plasma process and thus may also have an OES to subtract off a spectrum determined with a light source on to determine a reflectometry signal of the process film.

In various embodiments, method 700 may continue with, during such a cleaning process triggered by operation 745, determining whether the process film layer has been removed to a predetermined threshold thickness at block 750. The determination may be based on the dimensionless value indicative of the process film layer thickness. Such a determination may be to check whether the process film layer has been sufficiently reduced by the cleaning process. Once the process film layer has been removed to or beyond the predetermined threshold thickness, method 700 may continue with the processing logic triggering the processing chamber to end the cleaning process being performed within the processing chamber at block 755. Once completed, the method 700 may continue with processing substrates within the processing chamber at block 705.

Additional or similar methods to method 700 of FIG. 7 are envisioned. For example, during processing substrates within the processing chamber, the processing logic may detect a moment in time when the process film layer has reached a threshold level of thickness on the transparent thin film 307. The processing logic may further trigger an end to the deposition process that is depositing the deposited film layer within the processing chamber. The processing logic may make other similar decisions as this to update a process or process state of the processing chamber to improve substrate throughput, quality, and/or reduce produces shift.

According to some embodiments, the processing chamber may run a cleaning process after every substrate (or group of substrates) processed, after a determined number of operation hours, after a determined span of hours with plasma active in the chamber, after a volume of processing material is expended, or at some other periodicity. The processing logic can accurately determine the moment that the endpoint of this clean is reached on the distal surface 120B or 420B of the transparent thin film 307. It may then send a trigger the processing chamber to stop the clean and proceed to the next step, improving throughput. If the distal surface 120B or 420B does not clean at the same rate as the rest of the chamber, this difference can be characterized beforehand and compensated via a lookup table in the controller 109.

Figure 8:
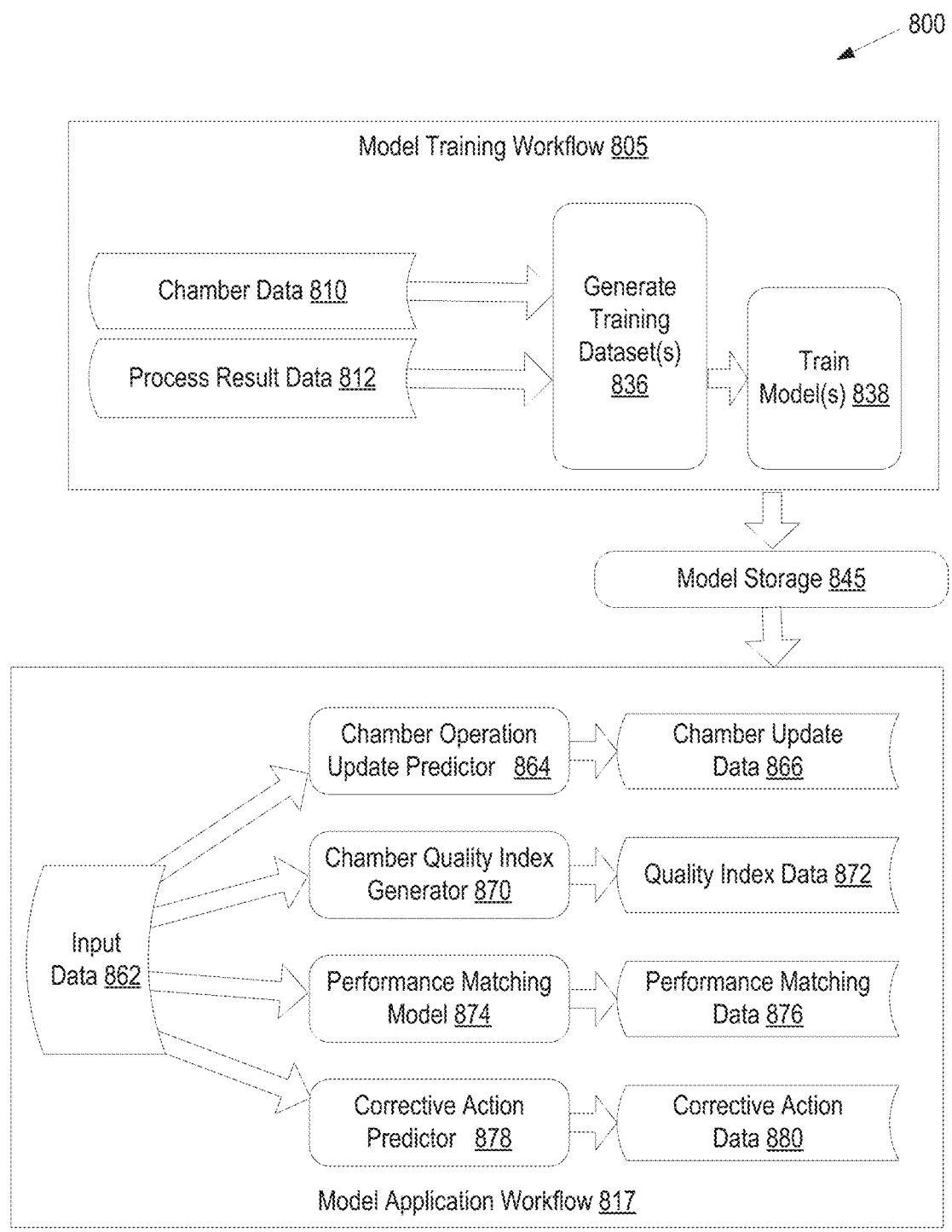
FIG. 8 illustrates a model training workflow and a model application workflow for chamber operation update prediction and simulation, according to some embodiments.

FIG. 8 illustrates a model training workflow and a model application workflow for chamber operation update prediction and simulation, according to aspects of the disclosure. In embodiments, the model training workflow 805 may be performed at a server which may or may not include chamber operation update predictor application, and the trained models are provided to chamber operation update predictor application, which may perform the model application workflow 817. The model training workflow 805 and the model application workflow 817 may be performed by processing logic executed by a processor of a computing device (e.g., modeling system 470 of FIG. 4). One or more of these workflows 805, 817 may be implemented by one or more machine learning modules implemented on a processing device and/or other software and/or firmware executing on a processing device. Workflows may be implemented by one or more physics-based models, such as optical models. Workflows may be implemented by one or more digital twin models. As used herein, a digital twin is a digital replica of a physical asset, such as a manufactured part. The digital twin includes characteristics of the physical asset at each stage of the manufacturing process, in which the characteristics include, but are not limited to, coordinate axis dimensions, weight characteristics, material characteristics (e.g., density, surface roughness), electrical characteristics (e.g., conductivity), optical characteristics (e.g., reflectivity), etc. In some embodiments, physics-based and digital twin models may be trained, for example to account for unknown information (e.g., variation within manufacturing tolerances of components), to correct for poor assumptions (e.g., non-ideal fluid flow), etc.

The model training workflow 805 is to train one or more machine learning models (e.g., deep learning models), physics-based models, etc., to perform one or more of determining, predicting, modifying, updating etc. tasks associated with a chamber operation update predictor (e.g., determining an update to a process operation associated with a processing chamber), and/or associated with a chamber matching tool, a sensor matching tool, a recipe development tool and/or a process control tool, as set forth in FIG. 4. The model application workflow 817 is to apply the one or more trained models to perform the determining and/or updating, etc. tasks for chamber data (e.g., raw sensor data, synthetic data, indicative of a state of a processing chamber). One or more of the machine may receive process result data (e.g., chamber operation updates).

Various model outputs are described herein. Particular numbers and arrangements of models are described and shown. However, it should be understood that the number and type of models that are used and the arrangement of such models may be modified to achieve the same or similar end results. Accordingly, the arrangements of models (e.g., machine learning models, physics-based models, etc.) that are described and shown are merely examples and should not be construed as limiting.

In some embodiments, one or more models are trained to perform one or more of the earlier described tasks. Each task may be performed by a separate model. Alternatively, a single model may perform each of the tasks or a subset of the tasks. Additionally, or alternatively, different models may be trained to perform different combinations of the tasks. In an example, one or a number of machine learning models may be trained, where the trained machine learning (ML) model is a single shared neural network that has multiple shared layers and multiple higher level distinct output layers, where each of the output layers outputs a different prediction, classification, identification, etc. The tasks that the one or more trained models may be trained to perform may include operation of chamber operation update predictor 864, chamber quality index generator 870, performance matching models 874, corrective action predictor 878, etc. As discussed previously, various input data such as sensor data, pre-processed data, synthetic data indicative of a state of a processing chamber before and/or after a chamber operation (e.g., a cleaning operation, a deposition operation, an etch operation, etc.) may be received and processed by the various machine learning models, rule-based models, physics-based models, etc., associated with model application workflow 817.

The chamber operation update predictor 864 may output various values (e.g., chamber update values, process recipe value adjustments, etc.) corresponding to various chamber operation updates based on various property values of a process film layer on an interior surface of a processing chamber wall (e.g., on a processing chamber liner). The various values may correspond to an index indicative of a state of the processing chamber. In some embodiments, the various values correspond to a ratio and/or percentage of an allowable process film layer thickness (e.g., of a critical wall thickness). The various values may be used by a processing device (e.g., of server 420 of FIG. 4) to determine an update to the chamber operation (e.g., operation parameters, control knobs, duration, etc.). Chamber operation update predictor 864 generates chamber update data 866, which may be utilized to alter a chamber, chamber operation, etc., for example to improve performance of the chamber.

Chamber quality index generator 870 may generate quality index data 872. In some embodiments, quality index data 872 may include a dimensionless index indicative of a quality of the chamber. In some embodiments, quality index data 872 may include one or more CWI indices. In some embodiments, a chamber quality index value (e.g., a CWI value) may be utilized as input for additional analysis (e.g., input data 862 into chamber operation update predictor 864, performance matching model 874, corrective action predictor 878, etc., may include one or more CWI values).

Performance matching model 874 may accept input data 862 and generate as output performance matching data 876. Performance matching model 874 may include one or more algorithms, physics-based models, machine learning models, etc., configured to accept input data (e.g., spectral data, OWPS data, CWI data) and generate as output performance matching data 876. Performance matching data 876 may include data associated with corrective actions to be performed associated with one or more forms of matching, e.g., chamber-to-chamber matching, current chamber performance to historical chamber performance matching, etc.

Corrective action predictor 878 may accept input data 862 and generate corrective action data 880 as output. Input data may include sensor data, processing parameter data, recipe data, product data, optical data, chamber quality index data, etc. Output may include recommended component replacement, recommended subsystem investigation (e.g., pressure subsystem, plasma generation subsystem, etc.), recommended maintenance, etc. In some embodiments, one or more blocks depicted in FIG. 8 may not be executed, e.g., an analysis data flow may not include performance matching operations associated with blocks 874 and 876.

One type of machine learning model that may be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In a plasma process tuning, for example, the raw input may be chamber data (e.g., raw sensor chamber measuring parameters such as temperature, pressure, material thickness, vacuum conditions, etc. within the chamber); the second layer may compose feature data associated with parameters associated with a substrate processing procedure or process recipe; the third layer may include historical threshold and chamber status under similar conditions. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

In one embodiment, one or more machine learning model is a recurrent neural network (RNN). An RNN is a type of neural network that includes a memory to enable the neural network to capture temporal dependencies. An RNN is able to learn input-output mappings that depend on both a current input and past inputs. The RNN will address past and future sensor and/or process result measurements and make predictions based on this continuous metrology information. RNNs may be trained using a training dataset to generate a fixed number of outputs (e.g., to determine a set of substrate processing rates, determine chamber conditions, and production mode requirements and conditions thresholds). One type of RNN that may be used is a long short term memory (LSTM) neural network.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset.

For the model training workflow 805, a training dataset containing hundreds, thousands, tens of thousands, hundreds of thousands or more chamber data 810 (e.g., sensor data, OWPS data, synthetic data indicative of states of associated processing chambers) should be used to form a training dataset. In some embodiments, the training dataset may also include an associated process result data 812 (e.g., measured chamber variables (e.g., critical dimensions, uniformity requirements, film thickness results, etc.)) for forming a training dataset, where each data point may include various labels or classifications of one or more types of useful information. Each case may include, for example, data indicative of a state of one or more processing chambers undergoing a process operation and/or associated process results of substrates evaluated during and/or after the process operation. This data may be processed to generate one or multiple training datasets 836 for training of one or more machine learning models. The machine learning models may be trained, for example, predict a chamber process operation parameter update.

To effectuate training, processing logic inputs the training dataset(s) 836 into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above.

Training may be performed by inputting one or more of the chamber data 810 and process result data 812 into the machine learning model one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences. For example, an output prediction or inference may include one or more modifications to plasma process data (e.g., modifications to one or more plasma exposure durations), updates to a cleaning recipe (e.g., an update to a duration of a cleaning recipe). Processing logic may cause the processing chamber to execute the updated process operation. Processing logic may compare results of the process operation subsequent to the update to results of the process operation prior to the update. Processing logic determines an error (i.e., a chamber update error) based on the difference between the identified process operation results. Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

Once the model parameters have been optimized, model validation may be performed to determine whether the model has improved and to determine a current accuracy of the deep learning model. After one or more rounds of training, processing logic may determine whether a stopping criterion has been met. A stopping criterion may be a target level of accuracy, a target number of processed data pieces from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 80% or 90% accuracy. In one embodiment, the stopping criterion is met if accuracy of the machine learning model has stopped improving. If the stopping criterion has not been met, further training is performed. If the stopping criterion has been met, training may be complete. Once the machine learning model is trained, a reserved portion of the training dataset may be used to test the model.

Once one or more trained machine learning models 838 are generated, they may be stored in model storage 845, and may be added to a manufacturing system (e.g., manufacturing system 402 of FIG. 4), modeling system (e.g., modeling system 470 of FIG. 4), etc. The modeling system, manufacturing system, etc., may then use the one or more trained ML models 838 as well as additional processing logic to implement an automatic mode, in which user manual input of information is minimized or even eliminated in some instances.

For model application workflow 817, according to one embodiment, input data 862 may be input into chamber operation update predictor 864, which may include a trained machine learning model. Based on the input data 862, chamber operation update predictor 864 outputs information indicating an update associated with a chamber process operation corresponding to a condition of a processing chamber.

In some embodiments, input data 862 may be provided to chamber quality index generator 870, and an indication of chamber quality may be output as quality index data 872. Chamber quality index generator 870 may include one or more trained machine learning models. In some embodiments, chamber quality index values may be utilized as input into further analysis models, e.g., machine learning models.

In some embodiments, input data 862 may be provided to performance matching model 874. Performance matching model 874 may include one or more machine learning models. Performance matching model 874 may be configured to generate data associated with performance matching, e.g., performance matching data 876. Performance matching may include matching chamber performance to the performance of another chamber (e.g., altering performance of a chamber to be more similar to a second chamber), match the performance of a chamber to historical performance (e.g., altering performance of a chamber to be more similar to processing runs performed that produced products meeting performance thresholds), etc.

In some embodiments, input data 862 may be provided to corrective action predictor 878. Corrective action predictor 878 may include one or more trained machine learning models. Corrective action predictor 878 may include supervised machine learning models, e.g., models trained using data labeled with an associated corrective action. Corrective action predictor 878 may generate as output corrective action data 880, which may include suggested corrective actions associated with input data 862.

Figure 9:
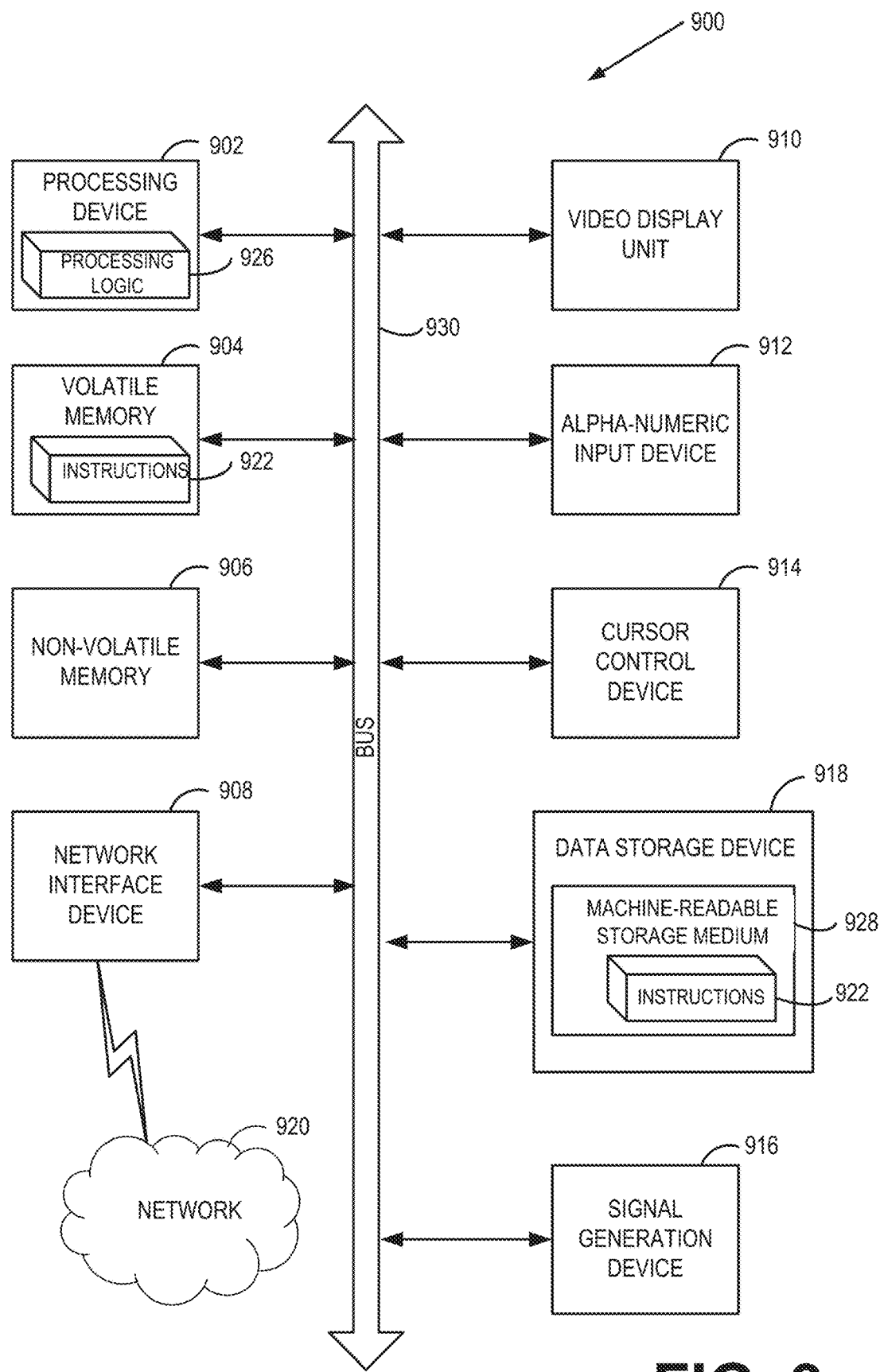
FIG. 9 depicts a block diagram of an example computing device, according to some embodiments.

FIG. 9 depicts a block diagram of an example computing device, operating in accordance with one or more aspects of the present disclosure. In various illustrative examples, various components of the computing device 900 may represent various components of the client devices 450, metrology system 410, server, 420, data store 140, and modeling system 470, illustrated in FIG. 4.

Example computing device 900 may be connected to other computer devices in a LAN, an intranet, an extranet, and/or the Internet. Computing device 900 may operate in the capacity of a server in a client-server network environment. Computing device 900 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 900 may include a processing device 902 (also referred to as a processor or CPU), a main memory 904 (e.g., read-only memory (ROM), flash memory, dynamic random access memory (DRAM) such as synchronous DRAM (SDRAM), etc.), a static memory 906 (e.g., flash memory, static random access memory (SRAM), etc.), and a secondary memory (e.g., a data storage device 918), which may communicate with each other via a bus 930.

Processing device 902 represents one or more general-purpose processing devices such as a microprocessor, central processing unit, or the like. More particularly, processing device 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 902 may be configured to execute instructions implementing methods 500A-D illustrated in FIGS. 5A-D, and/or processes 600A-D illustrated in FIGS. 6A-D.

Example computing device 900 may further comprise a network interface device 908, which may be communicatively coupled to a network 920. Example computing device 900 may further comprise a video display 910 (e.g., a liquid crystal display (LCD), a touch screen, or a cathode ray tube (CRT)), an alphanumeric input device 912 (e.g., a keyboard), a cursor control device 914 (e.g., a mouse), and an acoustic signal generation device 916 (e.g., a speaker).

Data storage device 918 may include a computer-readable storage medium (or, more specifically, a non-transitory machine-readable storage medium) 928 on which is stored one or more sets of executable instructions 922. In accordance with one or more aspects of the present disclosure, executable instructions 922 may comprise executable instructions associated with executing methods 500A-D illustrated in FIGS. 5A-D, and/or processes 600A-D illustrated in FIGS. 6A-D.

Executable instructions 922 may also reside, completely or at least partially, within main memory 904 and/or within processing device 902 during execution thereof by example computing device 900, main memory 904 and processing device 902 also constituting computer-readable storage media. Executable instructions 922 may further be transmitted or received over a network via network interface device 908.

While the computer-readable storage medium 928 is shown in FIG. 9 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," "receiving," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
    receiving, by a processing device, first sensor data indicating a state of a wall corresponding to a first processing chamber, the first sensor data comprising optical spectral data associated at least with light reflected off of a surface of a product disposed along a surface of the wall, a distal surface of a window in the wall, and a film on the distal surface of the window;
    determining, by the processing device, a first value based on the first sensor data, the first value corresponding to a first amount of the product disposed along the surface of the wall at a first time;
    determining, by the processing device, a first update to a first process operation associated with the first processing chamber based on the first value; and
    performing, by the processing device, one or more of (i) preparing a notification indicating the first update for presentation on a graphical user interface (GUI) or (ii) causing performance of the first process operation in accordance with the first update.

2. The method of claim 1, wherein the first sensor data is received from an optical wall process sensor (OWPS), the method further comprising:
    determining, by the processing device, an update to at least one of a sensor gain value or a sensor offset value corresponding to the OWPS based on the first value.

3. The method of claim 1, wherein the first value corresponds to the first amount of the product disposed along the surface at the first time, the method further comprising:
    determining, by the processing device, a second value based on the first sensor data, wherein the second value corresponds to a second amount of the product disposed along the surface of the wall at a second time; and
    determining, by the processing device, a process rate associated with the first process operation using the first value and the second value, wherein the first update is determined further using the process rate.

4. The method of claim 3, wherein the first update corresponds to at least one of a duration of the first process operation or an endpoint condition of the first process operation.

5. The method of claim 4, wherein at least one of the process rate or the endpoint condition is associated with at least one of a cleaning rate, an etch rate, or a deposition rate corresponding to the first processing chamber.

6. The method of claim 1, wherein the first value indicates a thickness of the product disposed along the surface of the wall.

7. The method of claim 1, further comprising:
    receiving, by the processing device, second sensor data indicating a second state of a second wall corresponding to a second processing chamber, wherein the second sensor data comprises second optical spectral data; and determining, by the processing device, a second value based on the second sensor data, wherein the second value corresponds to a second amount of the product disposed along a second surface of the second wall at a second time, wherein the first update is determined further using the second value.

8. The method of claim 7, further comprising:
causing, by the processing device, a performance of a calibration of one or more sensors associated with the first processing chamber based on a comparison between the first value and the second value.

9. The method of claim 1, further comprising:
performing, by the processing device, a data normalization using the first sensor data to determine the first value, wherein the first value comprises a normalized dimensionless value.

10. The method of claim 1, further comprising:
using, by the processing device, the first sensor data as input to a machine learning (ML) model; and
receiving, by the processing device, one or more outputs of the ML model, the one or more outputs indicating the first update.

11. A system comprising:
a first processing chamber comprising a first wall with an inner surface positioned within the first processing chamber;
an optical sensor coupled to the processing chamber, the optical sensor configured to acquire spectral data associated with the inner surface;
a memory; and
a processing device coupled to the memory, the processing device to:
receive first sensor data indicating a state of the first wall of the first processing chamber, the first sensor data comprising optical spectral data associated at least with light reflected off of a surface of a product disposed along the inner surface of the wall, a distal surface of a window in the wall, and a film on the distal surface of the window;
determine a first value based on the first sensor data, the first value corresponding to a first amount of the product disposed along the inner surface of the first wall at a first time;
determine a first update to a first process operation associated with the first processing chamber based on the first value; and
perform one or more of (i) prepare a notification indicating the first update for presentation on a graphical user interface (GUI) or (ii) cause performance of the first process operation in accordance with the first update.

12. The system of claim 11, wherein the first sensor data is received from an optical wall process sensor (OWPS), and wherein the processing device is further to:
determine an update to at least one of a sensor gain value or a sensor offset value corresponding to the OWPS based on the first value.

13. The system of claim 11, wherein the first value corresponds to the first amount of the product disposed along the surface at the first time, and wherein the processing device is further to:
determine a second value based on the first sensor data, wherein the second value corresponds to a second amount of the product disposed along the surface of the wall at a second time; and determine a process rate associated with the first process operation using the first value and the second value, wherein the first update is determined further using the process rate.

14. The system of claim 11, wherein the first value indicates a thickness of the product disposed along the surface of the wall.

15. The system of claim 11, wherein the processing device is further to:
receive second sensor data indicating a second state of a second wall corresponding to a second processing chamber, wherein the second sensor data comprises second optical spectral data; and
determine a second value based on the second sensor data, wherein the second value corresponds to a second amount of the product disposed along a second surface of the second wall,
wherein the first update is determined further using the second value.

16. A non-transitory machine-readable storage medium storing instructions which, when executed, cause a processing device to:
receive first sensor data indicating a state of a wall corresponding to a first processing chamber, the first sensor data comprising optical spectral data associated at least with light reflected off of a surface of a product disposed along a surface of the wall, a distal surface of a window in the wall, and a film on the distal surface of the window;
determine a first value based on the first sensor data, the first value corresponding to a first amount of the product disposed along the surface of the wall at a first time;
determine a first update to a first process operation associated with the first processing chamber based on the first value; and
perform one or more of (i) prepare a notification indicating the first update for presentation on a graphical user interface (GUI) or (ii) cause performance of the first process operation in accordance with the first update.

17. The non-transitory machine-readable storage medium of claim 16,
wherein the first sensor data is received from an optical wall process sensor (OWPS), and
wherein the processing device is further to:
determine an update to at least one of a sensor gain value or a sensor offset value corresponding to the OWPS based on the first value.

18. The non-transitory machine-readable storage medium of claim 17,
wherein the first value corresponds to the first amount of the product disposed along the surface at the first time, and wherein the processing device is further to:
determine a second value based on the first sensor data, wherein the second value corresponds to a second amount of the product disposed along the surface of the wall at a second time; and
determine a process rate associated with the first process operation using the first value and the second value, wherein the first update is determined further using the process rate.

19. The non-transitory machine-readable storage medium of claim 16,
wherein the processing device is further to:
receive second sensor data indicating a second state of a second wall corresponding to a second processing chamber, wherein the second sensor data comprises second optical spectral data; and determine a second value based on the second sensor data, wherein the second value corresponds to a second amount of the product disposed along a second surface of the second wall, wherein the first update is determined further using the second value.

20. The non-transitory machine-readable storage medium of claim 16, wherein the processing device is further to:

use the first sensor data as input to a ML model; and receive one or more outputs of the ML model, the one or more outputs indicating the first update.

* * * * *